(12) United States Patent
Zhang et al.

(10) Patent No.: US 12,446,370 B2
(45) Date of Patent: Oct. 14, 2025

(54) ACTIVE / PASSIVE CONTROL OF MICRO LED PERFORMANCE THROUGH SIDEWALL GATING

(71) Applicant: Apple Inc., Cupertino, CA (US)

(72) Inventors: Yuewei Zhang, Santa Barbara, CA (US); Fang Ou, San Jose, CA (US); Lei Zhang, Albuquerque, NM (US); Lina He, San Jose, CA (US); Paul S. Drzaic, Morgan Hill, CA (US); Xiaobin Xin, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 687 days.

(21) Appl. No.: 17/648,101

(22) Filed: Jan. 14, 2022

(65) Prior Publication Data

US 2022/0278255 A1 Sep. 1, 2022

Related U.S. Application Data

(60) Provisional application No. 63/155,011, filed on Mar. 1, 2021.

(51) Int. Cl.
| | |
|---|---|
| *H10H 20/831* | (2025.01) |
| *G09G 3/32* | (2016.01) |
| *H01L 25/075* | (2006.01) |
| *H10H 20/857* | (2025.01) |

(52) U.S. Cl.
CPC ........... *H10H 20/8314* (2025.01); *G09G 3/32* (2013.01); *H10H 20/857* (2025.01); *H01L 25/0753* (2013.01)

(58) Field of Classification Search
CPC ... H01L 33/385; H01L 33/62; H01L 25/0753; G09G 3/32; H10H 20/8314; H10H 20/857
USPC .......................................................... 257/79
See application file for complete search history.

(56) References Cited

U.S. PATENT DOCUMENTS

| | | | |
|---|---|---|---|
| 2015/0179876 A1* | 6/2015 | Hu | H01L 33/20 257/13 |
| 2016/0276538 A1* | 9/2016 | Zhao | H01L 33/44 |
| 2017/0104009 A1* | 4/2017 | Peng | H01L 29/458 |
| 2017/0194304 A1* | 7/2017 | Takeya | H01L 25/162 |
| 2017/0373228 A1* | 12/2017 | Chang | H01L 33/44 |
| 2018/0040638 A1* | 2/2018 | Wu | H10D 86/411 |
| 2018/0166429 A1* | 6/2018 | Chong | H01L 27/15 |
| 2019/0013306 A1* | 1/2019 | Wu | H01L 25/0753 |
| 2019/0123033 A1* | 4/2019 | Martin | H01L 24/16 |
| 2019/0157248 A1* | 5/2019 | Lee | H10D 86/441 |
| 2019/0157341 A1* | 5/2019 | Chang | H01L 27/124 |
| 2020/0027865 A1* | 1/2020 | Fan | H01L 25/0753 |
| 2020/0259055 A1* | 8/2020 | Iguchi | H01L 33/62 |
| 2020/0343230 A1 | 10/2020 | Sizov et al. | |

(Continued)

*Primary Examiner* — Eric W Jones

(74) *Attorney, Agent, or Firm* — Aikin & Gallant, LLP

(57) ABSTRACT

Display structures and methods of operation with micro light emitting diode (LED) sidewall gating are described. In an embodiment, a display structure includes a vertically oriented micro LED mounted on a display substrate, in which the micro LED includes a p-n diode with top and bottom electrode sides, and a sidewall gate electrode spanning a sidewall of the p-n diode where the active layer is included. In various embodiments, a bias may be applied to the sidewall gate electrode while driving the micro LED to deplete a minority carrier concentration from the sidewall of the p-n diode.

11 Claims, 18 Drawing Sheets

(56) References Cited

U.S. PATENT DOCUMENTS

| | | | |
|---|---|---|---|
| 2020/0357972 A1* | 11/2020 | Lutgen | G02B 27/4272 |
| 2021/0159378 A1* | 5/2021 | Lee | H01L 27/156 |
| 2022/0059738 A1* | 2/2022 | Biebersdorf | H01L 33/60 |
| 2022/0102583 A1* | 3/2022 | Baumheinrich | G02B 6/12004 |
| 2022/0115571 A1* | 4/2022 | Chen | H01L 33/486 |
| 2022/0262981 A1* | 8/2022 | Shakoor | H01L 33/005 |

\* cited by examiner

ACTIVE / PASSIVE CONTROL OF MICRO LED PERFORMANCE THROUGH SIDEWALL GATING

RELATED APPLICATIONS

This application claims the benefit of priority of U.S. Provisional Application No. 63/155,011 filed Mar. 1, 2021, which is incorporated herein by reference.

BACKGROUND

Field

Embodiments described herein relate to light emitting structures. More specifically, embodiments relate to micro light emitting diode (LED) based display panels.

Background Information

State of the art displays for portable electronics, computers, and televisions commonly utilize glass substrates with thin film transistors (TFTs) to control transmission of backlight through pixels based on liquid crystals. More recently emissive displays such as those based on organic light emitting diodes (OLEDs) have been introduced. Even more recently, it has been proposed to incorporate emissive inorganic semiconductor-based micro LEDs into high resolution displays. Compared to OLEDs, inorganic semiconductor-based micro LEDs may be more energy efficient and also may not be prone to lifetime degradation and extreme sensitivity to moisture.

Luminance typically increases with increasing operating current for inorganic semiconductor-based micro LEDs, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. Traditional methods for improving IQE include sidewall treatment and passivation to reduce sidewall defect density.

SUMMARY

Embodiments describe various active or passive sidewall gating schemes (connect to p-contact/n-contact, positive/negative bias, different capacitive coupling, in combination of device structural innovations, and introduction of fixed charges) to tune the charge status near the sidewalls, and therefore control the recombination process and charge transport near the sidewalls. This allows the screening or partial screening of the defect centers, and controls the efficiency loss near the sidewalls. It may also reduce the efficiency sensitivity to interface trap states and trap density. Sidewall gating in accordance with embodiments may be used to modify the internal quantum efficiency (IQE) trend and tune the peak IQE current in a large current density range, and therefore provide high emission efficacy and emission uniformity.

DETAILED DESCRIPTION

Figure 1:
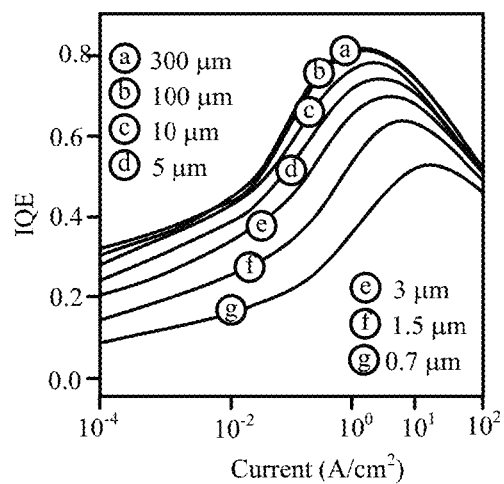
FIG. 1 is a plot of simulated micro LED internal quantum efficiency over current density for micro LEDs of different maximum widths.

Embodiments describe display structures including micro light emitting diode (LED) sidewall gating configurations to control the surface state of the micro LEDs near the micro LED sidewalls. For example, active sidewall gating configurations may include a sidewall gate electrode connected to either anode or cathode of the micro LED. In this manner the sidewall gate electrode can be actively controlled by the micro LED gate driver or charge sink (e.g. Vss). An active sidewall gating configuration may also be achieved with an independent sidewall gate electrode separately connected to a gate driver. In an embodiment passive sidewall gating is achieved by injection of a fixed charge into the p-n diode sidewalls of the micro LED. In particular, sidewall gating configurations may be used to control minority carrier concentration near the micro LED sidewalls.

In one aspect, efficiency of micro LEDs in accordance with embodiments may be mainly determined by three competing recombination process including Shockley-Read-Hall (SRH) recombination, band-to-band radiative recombination, and Auger recombination inside the active layer of the micro LEDs. In particular, micro LEDs may be prone to SRH recombination, also referred to as trap-assisted recombination, at the p-n diode sidewalls. SRH recombination may involve both electron and hole carriers, and the recombination rate may be determined by both trap concentration and carrier concentration. Specifically, the non-radiative recombination rate (U) may be characterized by:

$$U \sim Nt \ast \delta n \text{ (wherein } p \gg n\text{)} \quad (1)$$

$$U \sim Nt \ast \delta p \text{ (wherein } n \gg p\text{)} \quad (2)$$

where Nt corresponds to trap density, and δn corresponds to the minority (electron) carrier concentration when p concentration (holes) is greater than n concentration (electrons), and δp corresponds to the minority (holes) carrier concentration when n concentration (electrons) is greater than p concentration (holes). In accordance with embodiments, the sidewall gating may be performed to suppress the minority carrier concentration (δn or δp) from the p-n diode sidewalls of the micro LEDs. For example, a positive sidewall gate bias can be applied to deplete holes, and negative sidewall gate bias can be applied to deplete electrons. Sidewall gating may be further controlled by tuning effective potential differences between a sidewall gate electrode and the micro LED active layer with selection of gate material work functions and applied biases, and tuning capacitive coupling strength with dielectric layer thickness, dielectric constant, and material choice of the dielectric layer between the sidewall gate electrode and the p-n diode.

In accordance with embodiments, applying bias voltage to the micro LED device sidewall can tune the surface charge state of the micro LED, thus leading to further efficiency tuning which is usually determined by intrinsic material quality. Different sidewall gating schemes are proposed to tune the internal quantum efficiency of micro LEDs to realize optimum luminous efficacy at the target operation current levels. Sidewall gating can be used to modify micro LED sidewall charge status and screen SRH recombination centers near the sidewalls. It is realized via capacitive coupling through a dielectric layer or junction modulation through a semiconductor junction connected on the sidewalls.

When used, sidewall gating leads to either electron or hole accumulation near the sidewalls, and correspondingly depletion of holes or electrons, creating large imbalance between the two carrier types, which suppresses SRH recombination near the sidewalls. This leads to improved device efficiency especially at low current densities. At high current, the excessive accumulation of electrons could lead to more electron overflow and fast efficiency droop. In some embodiments, an electron blocking layer is included to couple with this sidewall gating scheme. In comparison, the excessive hole accumulation could lead to better hole injection and higher device efficiency at high current. Sidewall gating in accordance with embodiments can be realized through dielectric capacitive coupling or the introduction of either positive or negative fixed charges. The strength of sidewall gating can be further tunable through the choices of dielectric and sidewall contacts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a plot of simulated micro LED internal quantum efficiency (IQE) over current density (A/cm$^2$) is provided for micro LEDs of different maximum lateral widths between 300 μm and 0.7 μm. Such IQE is an intrinsic material property, that would typically be controlled by reducing defect density, improving material quality and structural design. However, it has been observed that sidewall surface defect states become highly influential for micro LED efficiency as a result of larger surface to volume ratio. As shown in FIG. 1, the IQE changes minimally between 300 μm and 100 μm with significant reduction at lower widths. In accordance with some embodiments micro LED structures are described in which a maximum lateral width or diameter of the isolated p-n diode is below 20 μm, or more specifically less than 10 μm.

It is believed that due to high SRH recombination, luminous efficacy is reduced at low current, leading to lower peak IQE, and a larger peak IQE current. While sidewall treatment and passivation could substantially reduce sidewall defect density, it is challenging to completely get rid of its impact on IQE, particularly since wide bandgap semiconductors are naturally prone to defect state formation in the bandgap. Furthermore, the interface between p-n diode semiconductors and dielectric layers (e.g. single crystalline to amorphous/poly crystal) can have a high interface trap density.

Figure 2:
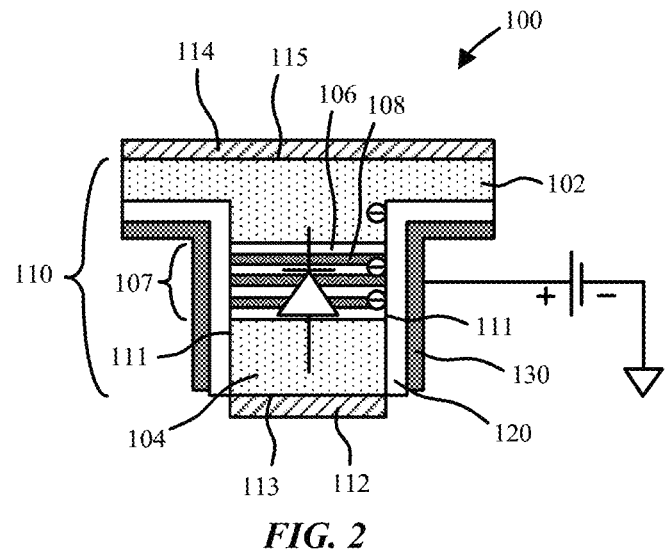
FIG. 2 is a schematic cross-sectional side view illustration of charge distribution with a positive potential applied to a micro LED sidewall gate electrode in accordance with an embodiment.

FIG. 2 is a schematic cross-sectional side view illustration of charge distribution with a positive potential applied to a micro LED sidewall gate electrode in accordance with an embodiment. Generally, the LEDs in accordance with embodiments may be vertical micro LEDs 100 including a p-n diode 110, a top electrode side 115, a bottom electrode side 113 with bottom electrode 112, and a sidewall gate electrode 130 spanning a sidewall 111 of the p-n diode including an active layer 107 of the p-n diode. For example, the p-n diodes 110 may be formed of inorganic semiconductor materials, such as III-V or II-VI materials. Exemplary materials include nitride-based semiconductors (e.g. GaN) and phosphorous-based semiconductors (e.g. AlInGaP, InGaP).

The sidewall gate electrode 130 in accordance with embodiments may be formed on one or more sidewalls 111 of the p-n diode 110, or completely laterally surround a thickness of the p-n diode. In an embodiment, the sidewall gate electrode is formed of metal layer, highly conductive semiconductor, or multi-layer stack. As shown, the p-n diode 110 includes an active layer 107 between a bottom doped layer 104 doped with a first dopant type (e.g. p-type or n-type), a top doped layer 102 doped with a second dopant type (e.g. n-type or p-type) opposite the first dopant type. The active layer 107 can include a plurality of quantum well layers 108 separated by barrier layers 106, for example. A dielectric layer 120 additionally spans along the p-n diode sidewall 111 between the p-n diode 110 and the sidewall gate electrode 130, and a top electrically conductive layer 114 is over and in electrical contact with the top electrode side 115. For example, the top electrically conductive layer 114 may be formed of a transparent or semitransparent material, such as transparent conductive oxides (TCOs) like indium tin oxide (ITO), transparent conductive polymers, etc. In the particular embodiment illustrated in FIG. 2, a positive bias applied to the sidewall gate electrode 130, which can result in hole depletion along the p-n diode 110 sidewall 111. For example, the bottom electrode 112 may be anode, with a p-type bottom doped layer 104, n-type top doped layer 102, and top electrically conductive layer as cathode.

Figure 3A:
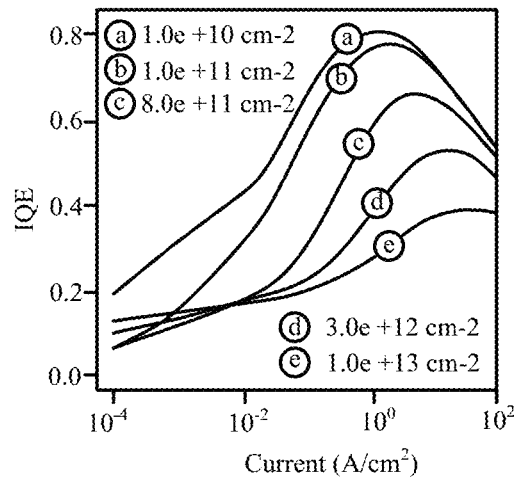
FIG. 3A is a plot of simulated micro LED internal quantum efficiency over current density for micro LEDs with different sidewall trap concentrations without sidewall gating.
Figure 3B:
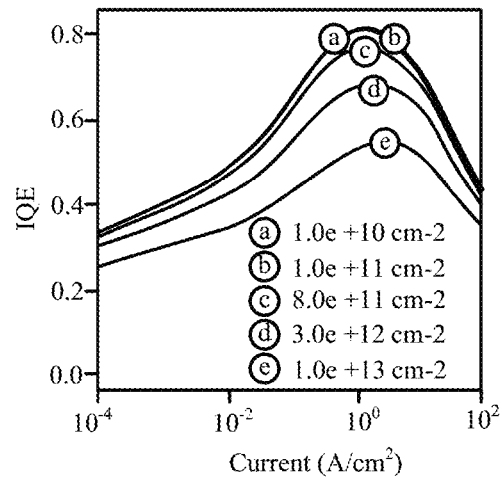
FIG. 3B is a plot of simulated micro LED internal quantum efficiency over current density for micro LEDs with different sidewall trap concentrations with positive bias sidewall gating in accordance with embodiments.

Referring now to FIG. 3A-3B plots of simulated micro LED IQE over current density are provided to illustrate how LED device efficiency can be improved and how the impact of trap concentration (cm$^{-2}$) variation in the display panel can be reduced with sidewall gating with positive bias applied to the sidewall gate electrode 130 (FIG. 3B) compared to no sidewall gating (FIG. 3A). As shown, the impact of positive bias sidewall gating is particularly effective at low current densities to reduce panel level non-uniformity caused by trap density variations among the micro LEDs across a display panel.

Figure 4:
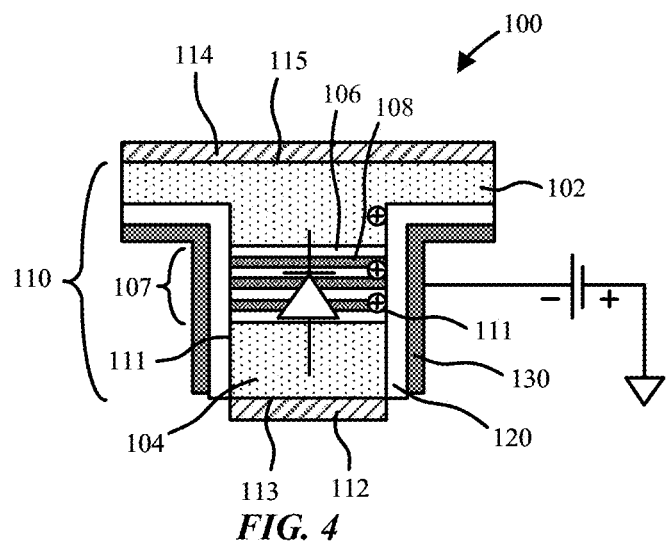
FIG. 4 is a schematic cross-sectional side view illustration of charge distribution with a negative potential applied to a micro LED sidewall gate electrode in accordance with an embodiment.

FIG. 4 is a schematic cross-sectional side view illustration of charge distribution with a negative potential applied to a micro LED sidewall gate electrode in accordance with an embodiment. For comparison, the micro LED structure is the same as that illustrated and described with regard to FIG. 2, with the only difference being negative potential applied to the micro LED sidewall gate electrode 130, which can result in electron depletion along the p-n diode 110 sidewall 111.

Figure 5:
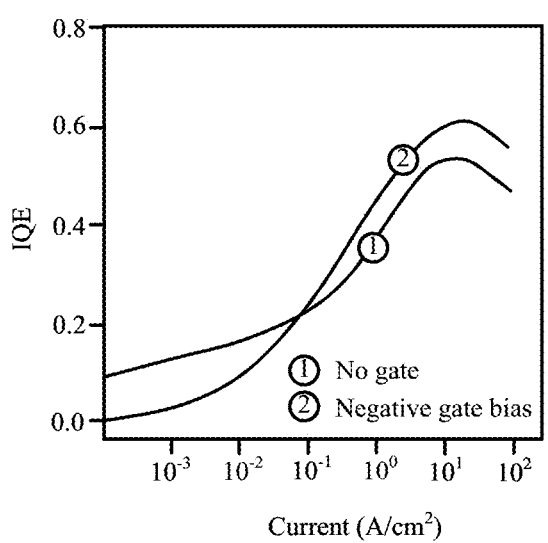
FIG. 5 is a plot of simulated micro LED internal quantum efficiency over current density for micro LEDs with and without negative bias sidewall gating in accordance with embodiments.

FIG. 5 is a plot of simulated micro LED internal quantum efficiency over current density for 0.7 μm wide micro LEDs with and without negative bias sidewall gating in accordance with embodiments. Such a mode of operation may be more effective at higher current density uses. As will be described with regard to FIGS. 6D-6E, rather than applying a negative bias, passive gating can be realized by introducing negative fixed charge or deep acceptor states.

Referring now to FIGS. 6A-6E, various general sidewall gating configurations are illustrated which can be implemented in accordance with embodiments to control the surface state of the micro LED near the micro LED sidewalls.

Figure 6A:
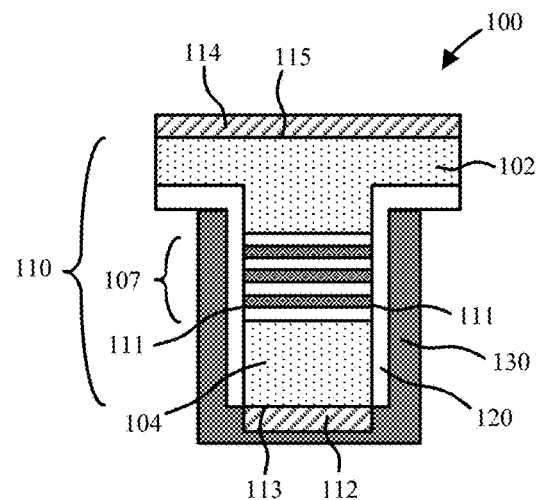
FIG. 6A is a schematic cross-sectional side view illustration of a micro LED with sidewall gate electrode connected to anode in accordance with an embodiment.

FIG. 6A is a schematic cross-sectional side view illustration of a micro LED 100 with sidewall gate electrode 130 connected to anode in accordance with an embodiment. Thus, the bottom electrode 112 is anode contact. In operation a positive potential is applied to the sidewall gate electrode 130, with hole depletion at the p-n diode sidewalls 111. A variety of structural variations are possible. For example, the dielectric layer 120 does not need to cover the entire bottom doped layer 104, and the sidewall gate electrode 130 can physically contact the p-n diode sidewalls 111 along the bottom doped layer 104. The sidewall gate electrode 130 may still be separated from the top doped layer 102 (n-type material) and top electrically conductive layer 114 (cathode) by the dielectric layer 120. The p-n diode sidewalls 111 can also be vertical, or inwardly or outwardly tapered (inclined).

In accordance with embodiments, the dielectric layer 120 at least covers (spans sidewalls 111) adjacent the active layer 107. The dielectric material of the dielectric layer 120 may be characterized as having a lower electron affinity as compared to the semiconductor layers in the active layer 107 of the micro LED 100. The dielectric layer 120 may have a maximum thickness of less than 300 nm. Different dielectric layer thicknesses can be used for devices targeting at different operation current densities. In an embodiment, the relative dielectric constant of the dielectric layer 120 is in the range of 3-500. Feasible materials include, but are not limited to, $Al_2O_3$, $HfO_2$, $SiO_2$, or a stack of different materials.

The sidewall gate electrode 130 in accordance with embodiments may be metal or highly conductive semiconductor layers, including aluminum, indium tin oxide (ITO), or a stack of different electrode materials. In addition, the metal layers could be highly reflective to the emitted light, and therefore, it could benefit for improved light extraction efficiency for the devices. In an embodiment, the sidewall gate electrode 130 has a work function in the range of 2-6 eV.

In an embodiment, the micro LED includes an electron blocking layer with high barrier for electron transport. For example, an electron blocking layer may be included near the active layer 107 within a p-doped bottom doped layer 104 connected to bottom electrode 112 (anode). The electron blocking layer could be AlGaN or InAlGaN for GaN based LEDs.

Figure 6B:
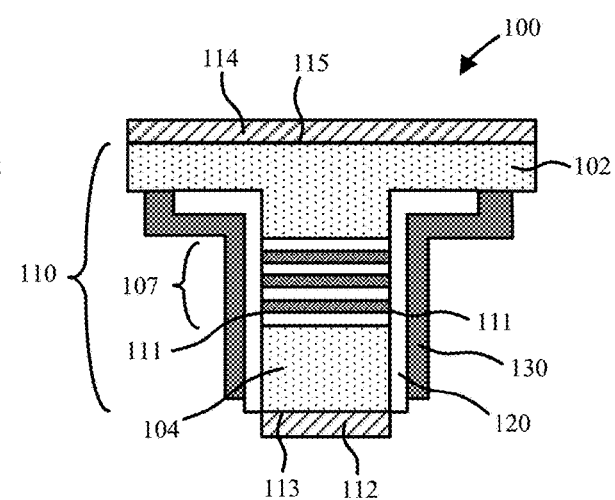
FIG. 6B is a schematic cross-sectional side view illustration of a micro LED with sidewall gate electrode connected to cathode in accordance with an embodiment.

FIG. 6B is a schematic cross-sectional side view illustration of a micro LED 100 with sidewall gate electrode 130 connected to cathode in accordance with an embodiment. Thus, the top electrically conductive layer 114 is cathode contact. In operation a negative potential is applied to the sidewall gate electrode 130, with electron depletion at the p-n diode sidewalls 111. A variety of structural variations are possible. For example, the sidewall gate electrode 130 could have direct contact to the top doped layer 102 (n-type layer) of the micro LED or the electrically conductive layer 114 cathode electrode. The dielectric layer 120 material may have a positive valence band offset with respect to the semiconductor layers in the active layer 107 of the micro LED. The dielectric layer 120 may at least cover the active layer 107. The dielectric layer 120 may have a maximum thickness of less than 300 nm. Different dielectric layer thicknesses can be used for devices targeting at different operation current densities. In an embodiment, the relative dielectric constant of the dielectric layer 120 is in the range of 3-500. Feasible materials include, but are not limited to, $Al_2O_3$, $HfO_2$, $SiO_2$, wide bandgap semiconductors such as AlN, or a stack of different materials. The p-n diode sidewalls 111 can also be vertical, or inwardly or outwardly tapered (inclined).

The sidewall gate electrode 130 in accordance with embodiments may be metal or highly conductive semiconductor layers, including aluminum, indium tin oxide (ITO), or a stack of different electrode materials. In addition, the metal layers could be highly reflective to the emitted light, and therefore, it could benefit for improved light extraction efficiency for the devices. In an embodiment, the sidewall gate electrode 130 has a work function in the range of 4-7 eV.

In an embodiment, the micro LED includes an electron blocking layer with high barrier for electron transport. For example, an electron blocking layer may be included near the active layer 107 within a p-doped bottom doped layer 104 connected to bottom electrode 112 (anode). The electron blocking layer could be AlGaN or InAlGaN for GaN based LEDs.

Figure 6C:
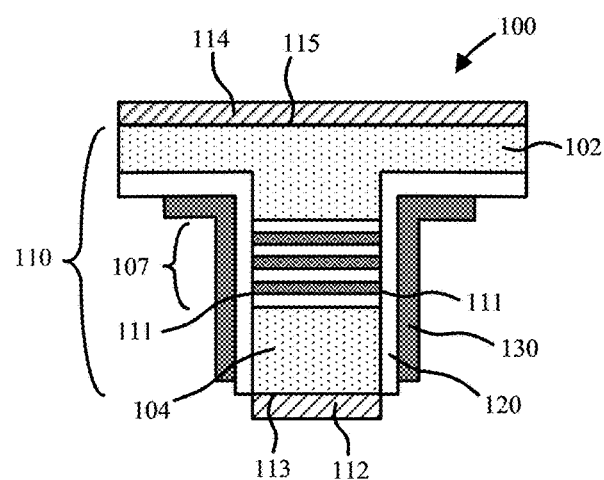
FIG. 6C is a schematic cross-sectional side view illustration of a micro LED with separate sidewall gate electrode in accordance with an embodiment.

FIG. 6C is a schematic cross-sectional side view illustration of a micro LED with a separate (or free standing) sidewall gate electrode 130 in accordance with an embodiment. In accordance with embodiments, the sidewall gate electrode 130 can be controlled by a voltage source independent of both the anode and the cathode contacts of the micro LED 100. In operation, either a positive or negative potential can be applied to the sidewall gate electrode 130, with corresponding hole or electron depletion at the p-n diode sidewalls 111. A variety of structural and operational variations are possible. In an embodiment the voltage on the sidewall gate electrode 130 is varied when the micro LED 100 is operated at different current levels for the realization of an optimum efficiency. The sidewall gate electrode 130 could have a constant voltage bias or a pulsed waveform during device operation. By way of example, the sidewall gate electrode 130 voltage can be tuned in a range from −10 V to 10 V.

In accordance with embodiments, the dielectric layer 120 at least covers (spans sidewalls 111) adjacent the active layer 107. The dielectric layer 120 may have a maximum thickness of less than 300 nm. Different dielectric layer thicknesses can be used for devices targeting at different operation current densities. In an embodiment, the relative dielectric constant of the dielectric layer 120 is in the range of 3-500. Feasible materials include, but are not limited to, $Al_2O_3$, $HfO_2$, $SiO_2$, or a stack of different materials.

The sidewall gate electrode 130 in accordance with embodiments may be metal or highly conductive semiconductor layers, including aluminum, indium tin oxide (ITO), or a stack of different electrode materials. In addition, the metal layers could be highly reflective to the emitted light, and therefore, it could benefit for improved light extraction efficiency for the devices. In an embodiment, the sidewall gate electrode 130 has a work function in the range of 2-7 eV.

In an embodiment, the micro LED includes an electron blocking layer with high barrier for electron transport. For example, an electron blocking layer may be included near the active layer 107 within a p-doped bottom doped layer 104 connected to bottom electrode 112 (anode). The electron blocking layer could be AlGaN or InAlGaN for GaN based LEDs.

Figure 6D:
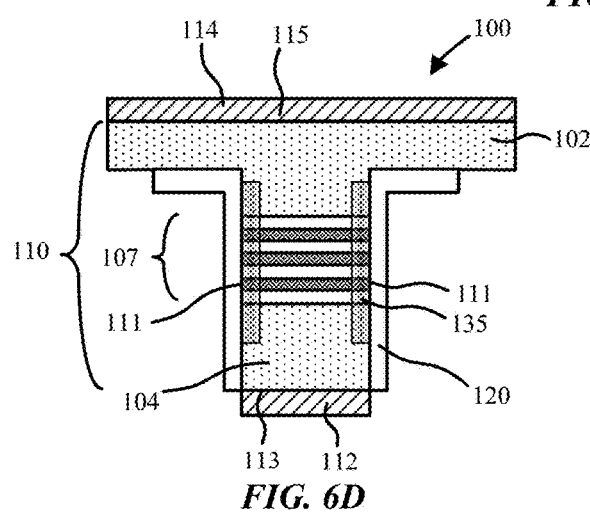
FIGS. 6D-6E are schematic cross-sectional side view illustrations of micro LEDs with injection of fixed charge for passive gating in accordance with an embodiment.

FIG. 6D is a schematic cross-sectional side view illustration of a micro LED with injection of fixed charge for passive gating in accordance with an embodiment. In such an embodiment, the micro LED 100 is gated by fixed charges in an injection region 135 near the sidewalls 111 of the p-n diode 110 spanning at least the active layer 107. In operation the injection region 135 can have either positive or negative fixed charges to form a corresponding hole or electron barrier. In a particular embodiment, negative fixed charges can be introduced to the sidewalls 111 to form the injection region 135 within the p-n diode 110 inside the sidewalls 111. For example, this can include the introduction of fluorine ions at the sidewall 111 surface. The fixed charges can be introduced using a suitable process such as low energy plasma treatment, high temperature annealing or ion implantation process. The injection region 135 of fixed charges may be distributed in a range (e.g. width) of less than 500 nm away from the p-n diode 110 sidewalls 111 in an embodiment, and can cover at least the active layer 107 sidewall 111.

Figure 6E:
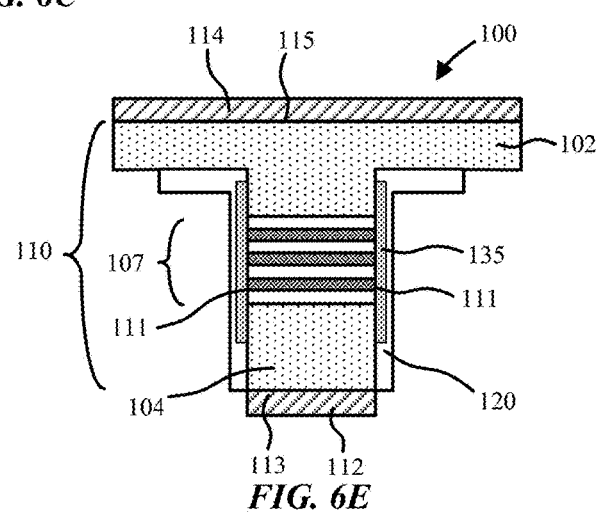

Referring now to FIG. 6E, the injection region 135 of fixed charges can alternatively, or additionally, exist in the interface of the dielectric layer 120 and p-n diode 110, or inside the dielectric layer 120. Specifically, semiconductors offering strong spontaneous polarization charges can be used as a gating dielectric layer 120 to provide passive gating of the sidewalls 111. Exemplary semiconductor materials include ScGaN, ScAlN, $\varepsilon$-$Ga_2O_3$. Active sidewall gating can be further implemented through a dielectric layer or a metal-semiconductor junction contact. Negative bias is preferred when negative fixed charges are introduced on the sidewalls 111.

FIGS. 7A-7D are schematic cross-sectional side view illustrations of a sequence for forming a micro LED 100 with sidewall gate electrode 130 connected to anode in accordance with an embodiment. Specifically, a close-up illustration is provided for the fabrication sequence of two adjacent micro LEDs 100, though the process sequence is understood to be of an array of micro LEDs 100 on the order of tens of thousands at a minimum depending upon donor p-n diode wafer size. As shown, in FIG. 7A a donor p-n diode wafer 201 includes a handle substrate 202 (wafer) and optional epitaxial buffer layer 204, which can be formed of a p-n diode material that is epitaxially grown on the handle substrate 202 material, and generate a growth layer that mitigates defects that occur due to lattice mismatch between heterogenous materials. An epitaxial p-n diode layer 109 is then grown on the buffer layer 204, including what may become top doped layer 102, active layer 107, and bottom doped layer 104.

Figure 7A:
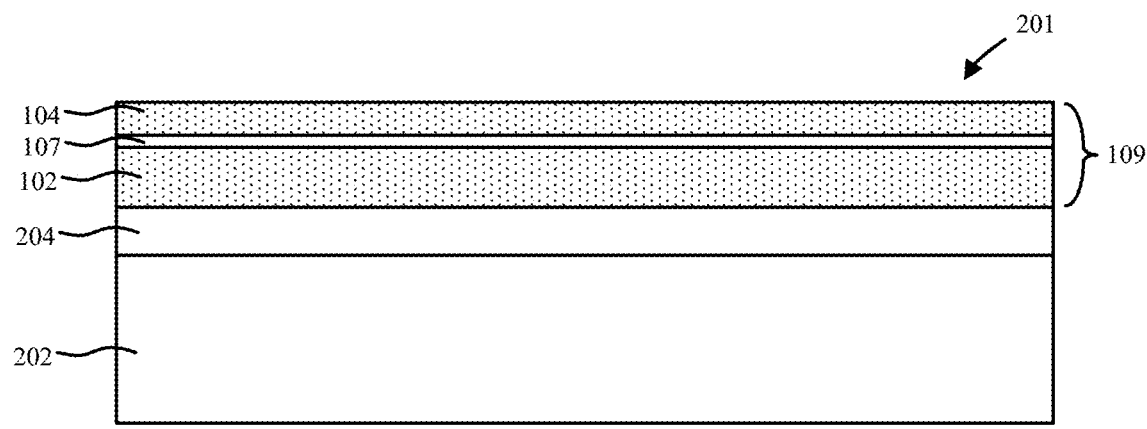
FIGS. 7A-7D are schematic cross-sectional side view illustrations of a sequence for forming a micro LED with sidewall gate electrode connected to anode in accordance with an embodiment.
Figure 7B:
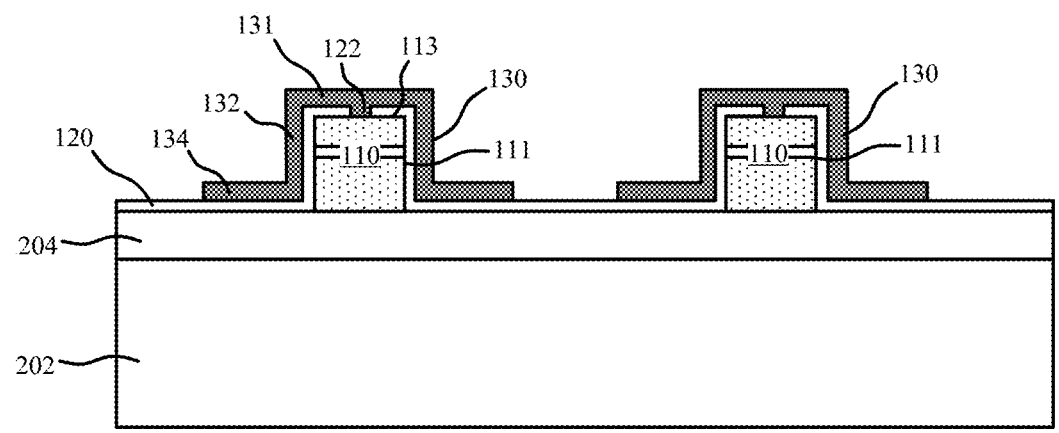

Isolated p-n diode 110 mesas can then be formed as shown in FIG. 7B using suitable etching techniques, followed by the deposition of dielectric layer 120, and sidewall gate electrodes 130. In this instance, the dielectric layer 120 may first be deposited and patterned to form openings 122 exposing the bottom electrode sides 113 of the various p-n diode 110 mesas. A conductive layer or layer stack, may then be formed and patterned to form the sidewall gate electrodes 130. As shown, each sidewall gate electrode 130 may include a sidewall layer portion 132 spanning (e.g. conformal to) the sidewalls 111 and a top lateral flanged layer portion 134 spanning the dielectric layer 120 over the buffer layer 204, and a wrap-around layer portion 131 which is formed over the p-n diode 110 mesas, on the bottom electrode sides 113, and within the openings 122. In the final micro LED 100 structures the wrap-around layer portion 131 may span underneath the p-n diode 110 mesas.

Figure 7C:
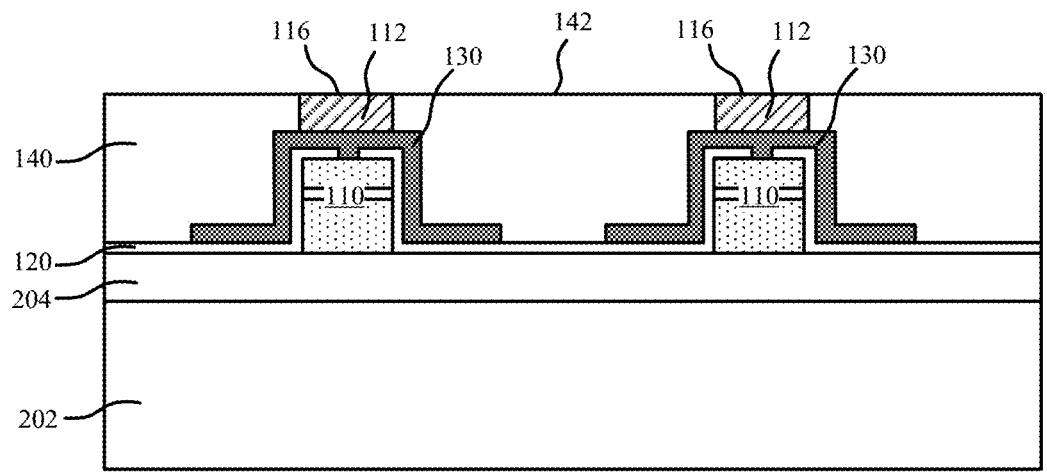
Figure 7D:
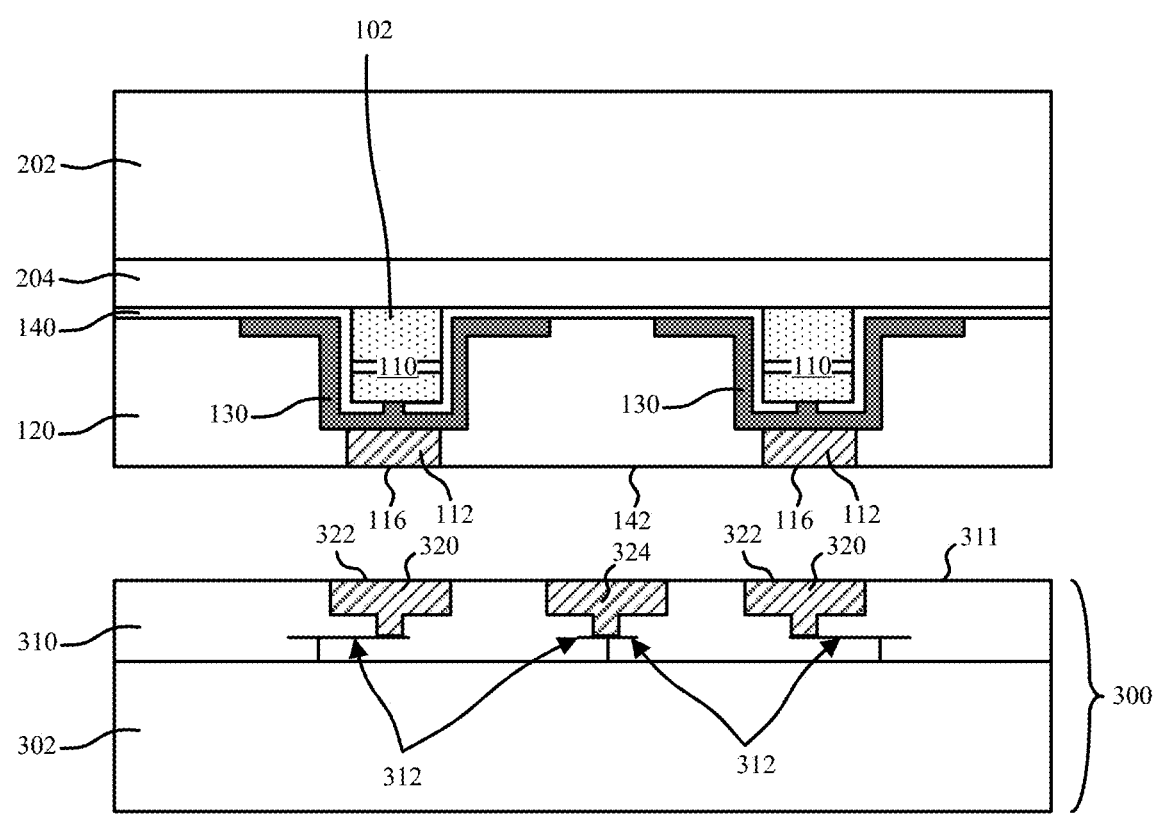

Referring now to FIG. 7C a (planarizing) dielectric fill layer 140 and bottom electrode 112 are formed. Order of formation of the materials for the dielectric fill layer 140 and bottom electrode 112 can vary. In either case, a planarization option can be performed to form planarized bottom surfaces 116, 142 of the bottom electrode 112, and dielectric fill layer 140 to prepare the (e.g. wafer) structure for bonding to a display substrate 300. The patterned growth substrate of FIG. 7C can then be bonded to a display substrate 300 as shown in FIG. 7D. In an exemplary embodiment, the display substrate 300 can be a semiconductor substrate with patterned circuitry, such as complementary metal oxide semiconductor (CMOS) circuits. In particular the display substrate 300 can include a base substrate 302 (e.g. silicon) and device layer 310 within which certain driver circuits 312 and driver contact pads 320 are formed. The device layer 310 may additionally include contact pads 324 to complete the driver circuits.

Bonding may be achieved using a variety of methods, such as flip chip, hybrid bonding, etc. In a specific embodiment, a hybrid bonding technique is utilized in which bottom surfaces 116 of the bottom electrodes 112 are bonded to top surfaces 322 of the driver contact pads 320 with a metal-metal bond, and a bottom surface 142 of the dielectric fill layer 140 (e.g. oxide bonding layer) is bonded to a top surface 311 of the device layer 310 with an oxide-oxide bond. The display substrate 300 may be a variety of substrates including polymer, glass, silicon, etc. and may be rigid or flexible.

Figure 8A:
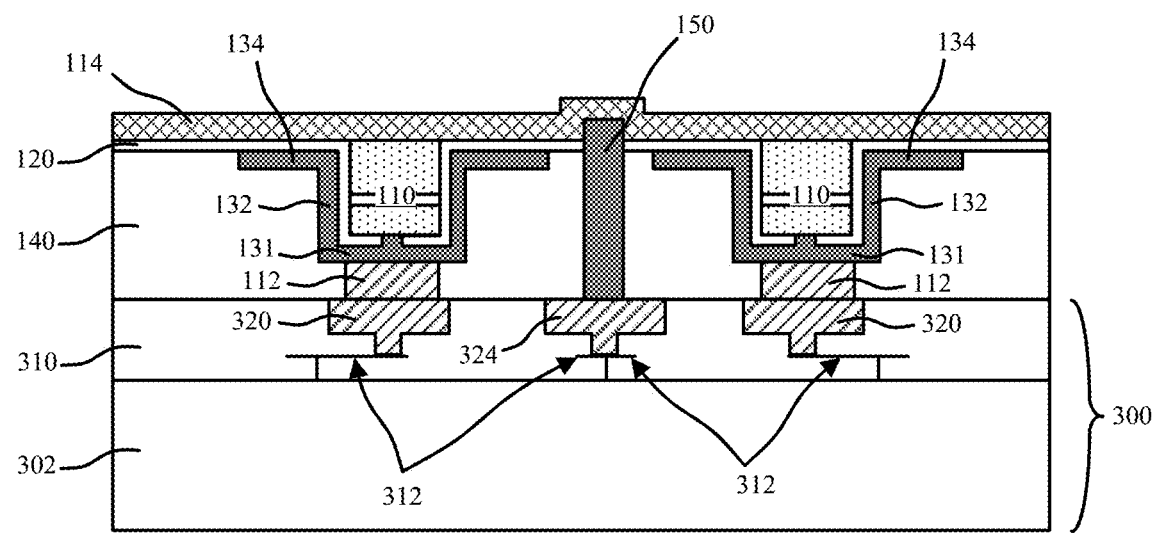
FIG. 8A is a schematic cross-sectional side view illustration of a first option of a micro LED with sidewall gate electrode connected to anode in accordance with an embodiment.
Figure 8B:
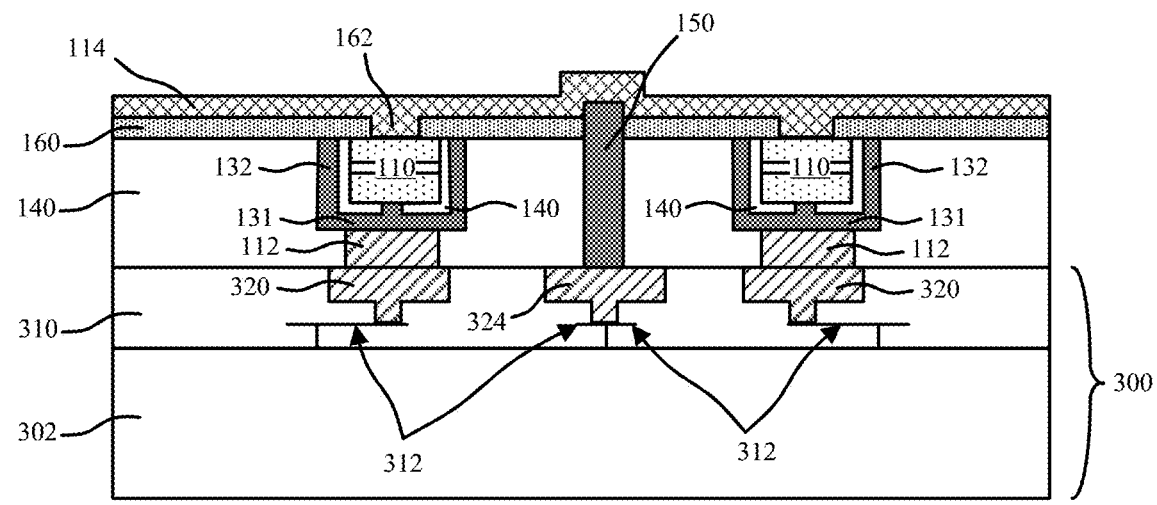
FIG. 8B is a schematic cross-sectional side view illustration of a second option of a micro LED with sidewall gate electrode connected to anode in accordance with an embodiment.

As previously described with regard to FIG. 6A a variety of structural variations are possible where connecting the sidewall gate electrode 130 to anode. FIG. 8A is a schematic cross-sectional side view illustration of a first option of a micro LED with sidewall gate electrode 130 connected to anode in accordance with an embodiment. FIG. 8B is a schematic cross-sectional side view illustration of a second option of a micro LED with sidewall gate electrode 130 connected to anode in accordance with an embodiment. In both embodiments, a contact terminal 150 may be formed to connect the top electrically conductive layer 114 to the display substrate 300 circuitry. A contact terminal can be formed for each pixel or a matrix of pixels within the pixel array. Alternatively, the contact terminal can be located outside the pixel array. Thus, a single or multiple contact terminals 150 can be located outside of the pixel array, for example to provide a common cathode contact.

Following the bonding operation illustrated in FIG. 7D, the handle substrate 202 may then be removed. This may be followed by thinning of the epitaxial buffer layer 204 to form discrete micro LEDs 100. In the embodiment illustrated in FIG. 8A, the sidewall gate electrode 130 remains intact. Furthermore, the dielectric layer 120 may remain intact. In the embodiment illustrated in FIG. 8B, thinning may include removing portion of the dielectric layer 120 and the top lateral flanged layer portion 134 of the sidewall gate electrode 130. This may optionally include thinning of the doped layer 102 (e.g. n-doped). Individual contacts may optionally be formed on the top electrode sides 115 of the p-n diodes 110. In either sequence, an insulating layer 160 (e.g. oxide, nitride, etc.) can be deposited over the thinned surface and patterned to form openings 162. One or more top electrically conductive layers 114 are then formed over the micro LEDs 100. The top electrically conductive layer 114 may be a common layer shared by multiple micro LEDs 100, across multiple pixels in some embodiments.

The top electrically conductive layer 114 may additionally be formed on a contact terminal 150. For example, the contact terminal may connect to ground or low voltage (Vss) line. As shown, the contact terminal 150 may be in the form of a plug or via extending through the dielectric fill layer 140. In an embodiment, contact terminal 150 is on a corresponding contact pad 324 of the display substrate 300. The contact terminal 150 may be formed at a variety of stages. For example, the contact terminal 150 may be formed along with the bottom electrodes 112. In such an embodiment, the contact terminal 150 may be bonded to the contact pad 324 with a metal-metal bond during a hybrid bonding technique. The contact terminal 150 may optionally be formed after removing the handle substrate 202.

Figure 9A:
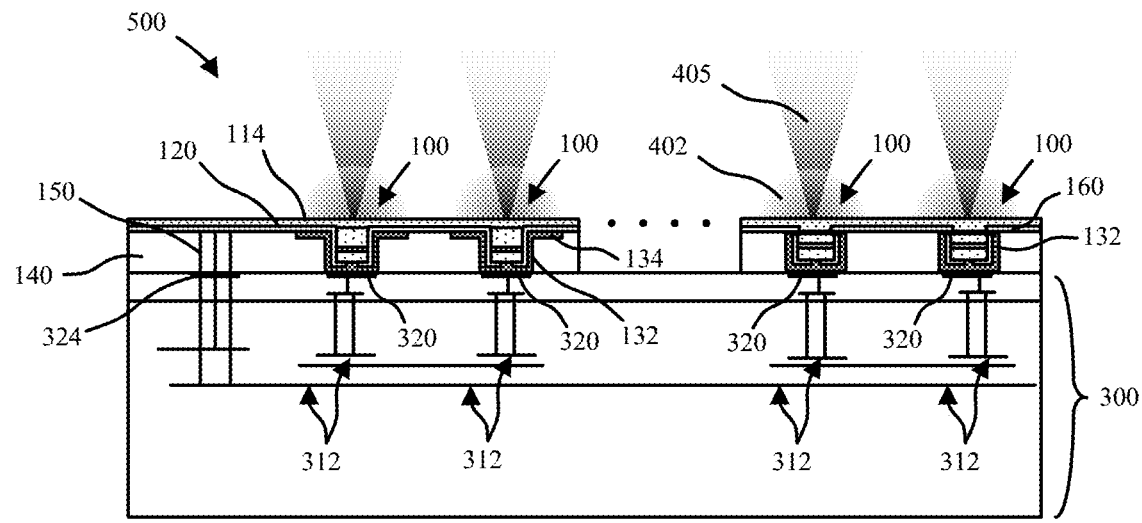
FIG. 9A is a schematic cross-sectional side view illustration of a display structure including micro LEDs with sidewall gate electrodes connected to anodes and driven by a transistor driving circuit in accordance with an embodiment.
Figure 9B:
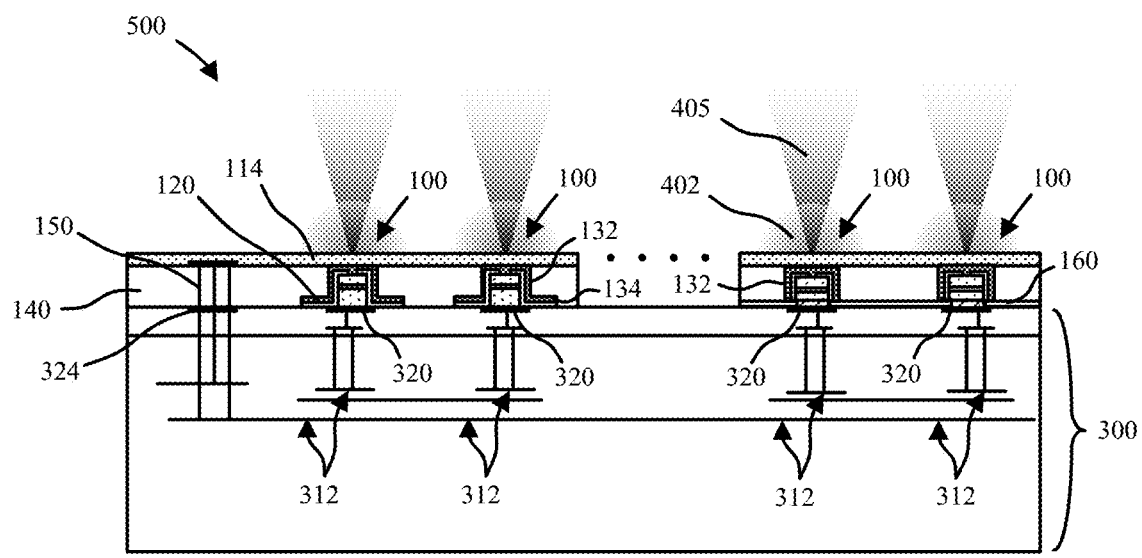
FIG. 9B is a schematic cross-sectional side view illustration of a display structure including micro LEDs with sidewall gate electrodes connected to anodes and driven by a transistor driving circuit in accordance with an embodiment.

FIG. 9A is a schematic cross-sectional side view illustration of a display structure 500 including micro LEDs 100 of FIGS. 8A and 8B with sidewall gate electrodes 130 connected to anodes and driven by a transistor driver circuit in accordance with an embodiment. More particularly, FIG. 9A illustrates an arrangement micro LEDs 100 of FIG. 8A on the left side of the illustration, and micro LEDs 100 of FIG. 8B on the right in order to illustrate similar integration schemes. FIG. 9B is a schematic cross-sectional side view illustration of a display structure 500 including micro LEDs 100 with sidewall gate electrodes connected to anodes and driven by a transistor driver circuit in accordance with an embodiment. FIG. 9B is similar to FIG. 9A, with the micro LEDs 100 inverted.

In an embodiment, a display structure 500 includes a display substrate 300 including a driver contact pad 320. A micro LED 100 is connected to the display substrate, with the micro LED 100 including a p-n diode 110 characterized by a top electrode side 115, a bottom electrode side 113 connected with the driver contact pad 320, and an active layer therebetween. A sidewall gate electrode 130 spans a sidewall 111 of the p-n diode 110 that includes the active layer 107. In operation, a bias may be applied to the sidewall gate electrode 130 to deplete a minority carrier concentration from the sidewall 111. A dielectric layer 120 additionally may span along the p-n diode sidewall 111 between the p-n diode 110 and the sidewall gate electrode 130. A top electrically conductive layer 114 additionally may span over and in electrical contact with the top electrode side 115. In a particular application, a lens 402 can be formed over each micro LED 100. For example, the lenses 402 may be half-ball shaped transparent, high index material to control on-axis light intensity of the emission cone 405. For example, a high index material may have an index of refraction of n=1.2-2.5. Embodiments are not limited to half-ball shaped lenses, and can include alternative shapes such as conical.

As illustrated in FIGS. 9A-9B, the sidewall gate electrode 130 may completely cover the top or bottom side of the p-n diode 110. In an embodiment, the sidewall gate electrode 130 spans underneath the p-n diode 110 and is connected to the bottom electrode side 113. In some embodiments, the sidewall gate electrode 130 includes a sidewall layer portion 132 and a top lateral flanged layer portion 134, with the dielectric layer spanning over the top lateral flanged layer portion 134 of the sidewall gate electrode 130. In some embodiments, the display structure 500 includes an insulating layer 160 over the micro LED 100 and the dielectric layer 120, and an opening 162 the insulating layer 160 over the micro LED 100, where the top electrically conductive layer 114 at least partially fills the opening 162 to contact the top electrode side 115.

Referring now to FIGS. 10A-10D schematic cross-sectional side view illustrations are provided of a sequence for forming a micro LED 100 with sidewall gate electrode 130 connected to cathode in accordance with an embodiment. The process sequence may begin with a donor p-n diode wafer 201 similar to that previously described with regard to FIG. 7A. An array of p-n diodes 110 are then patterned as previously described, followed by the formation of dielectric layer 120. In the embodiment illustrated in FIG. 10B the dielectric layer 120 can be patterned, optionally followed by the formation of conductive vias 170. Conductive vias 170 may be formed of any conductive material, such as metal, transparent conductive oxides, etc. For example, the conductive vias 170 may be copper. In an alternative sequence the conductive vias 170 are formed prior to dielectric layer 120, followed by patterning of the dielectric layer 120 to expose the conductive vias 170. Still referring to FIG. 10B, sidewall gate electrodes 130 are then formed over the dielectric layer 120, as well as on and in electrical contact with the conductive vias 170. The conductive vias 170 may include a sidewall layer portion 132 and a top lateral flanged layer portion 134. In the illustrated embodiment, the sidewall layer portion 132 does not cover the bottom electrode side 113 of the p-n diode, and span along only a partial thickness of the doped layer 104.

Figure 10A:
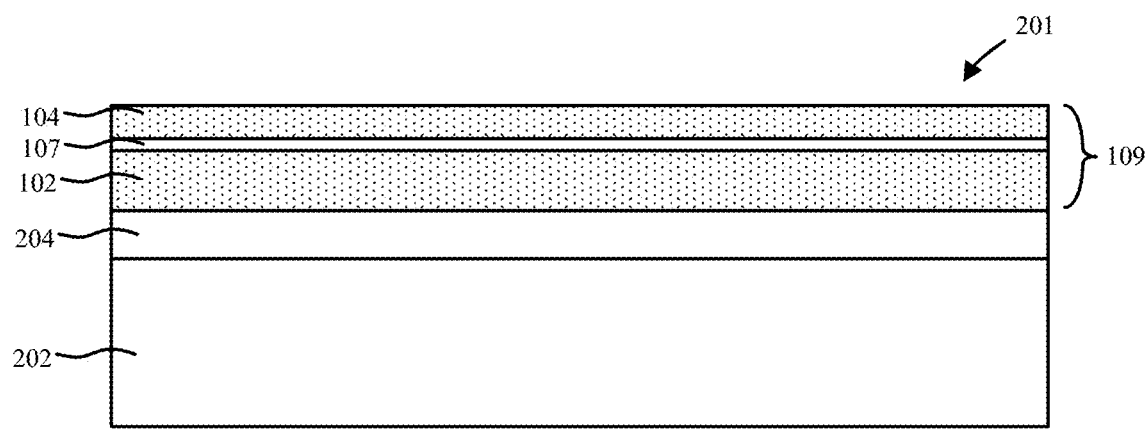
FIGS. 10A-10D are schematic cross-sectional side view illustrations of a sequence for forming a micro LED with sidewall gate electrode connected to cathode in accordance with an embodiment.
Figure 10B:
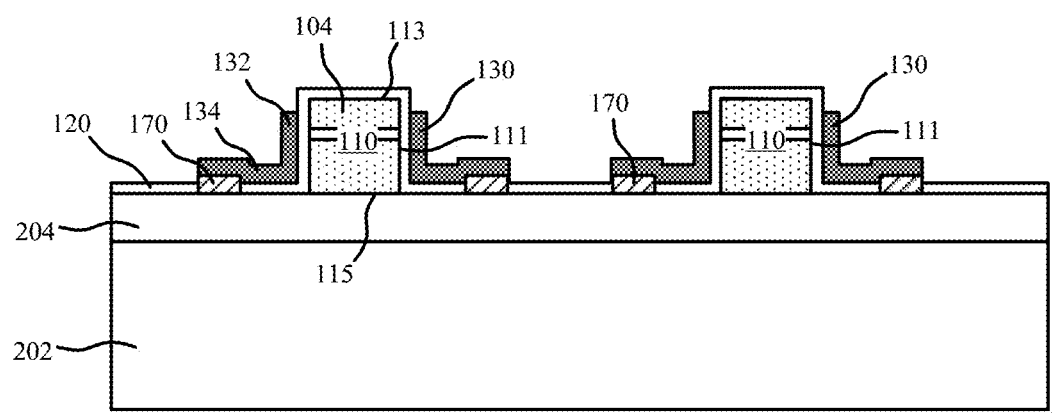
Figure 10C:
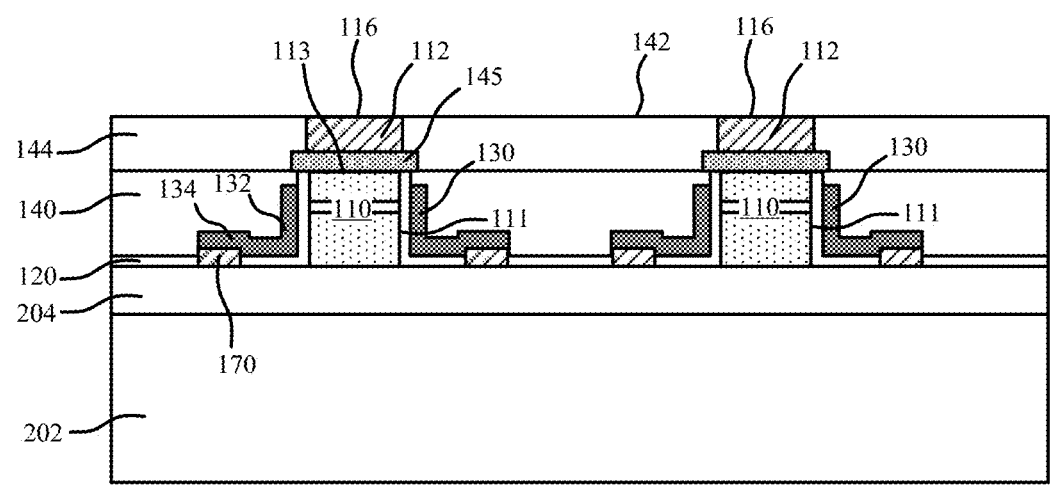
Figure 10D:
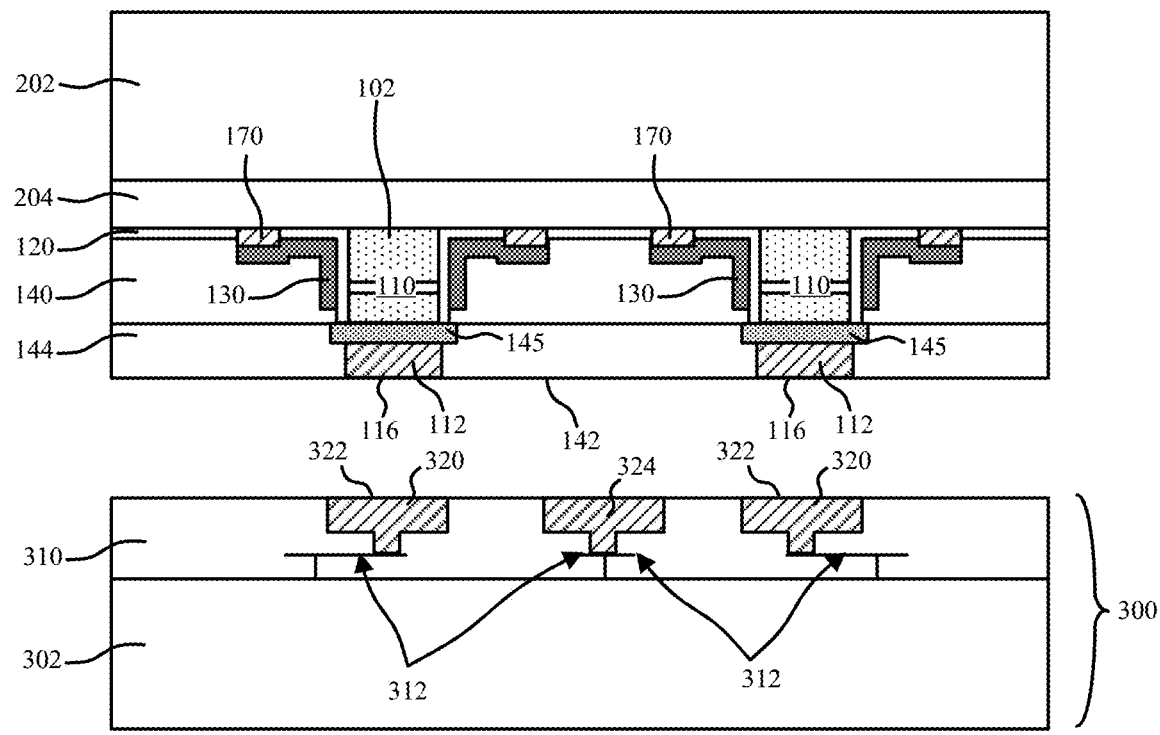

A dielectric fill layer 140 can then be deposited over the patterned structure as shown in FIG. 10C, and planarized to expose, or re-establish the bottom electrode side 113 of the p-n diode 110. The planarization operation may optionally reduce a thickness of the doped layer 104. Separate electrode contact layers 145 can then be formed on the bottom electrode side 113 of each p-n diode 110. This may be followed by deposition of a planarization layer 144, followed by patterning, formation of bottom electrodes 112 in the patterned planarization layer 144, and a final planarization operation to prepare planarized bottom surfaces 116 and 142 for bonding. As shown, in FIG. 10D, the patterned growth substrate of FIG. 10C can then be bonded to a display substrate 300 similarly as previously described with regard to FIG. 7D.

Figure 11A:
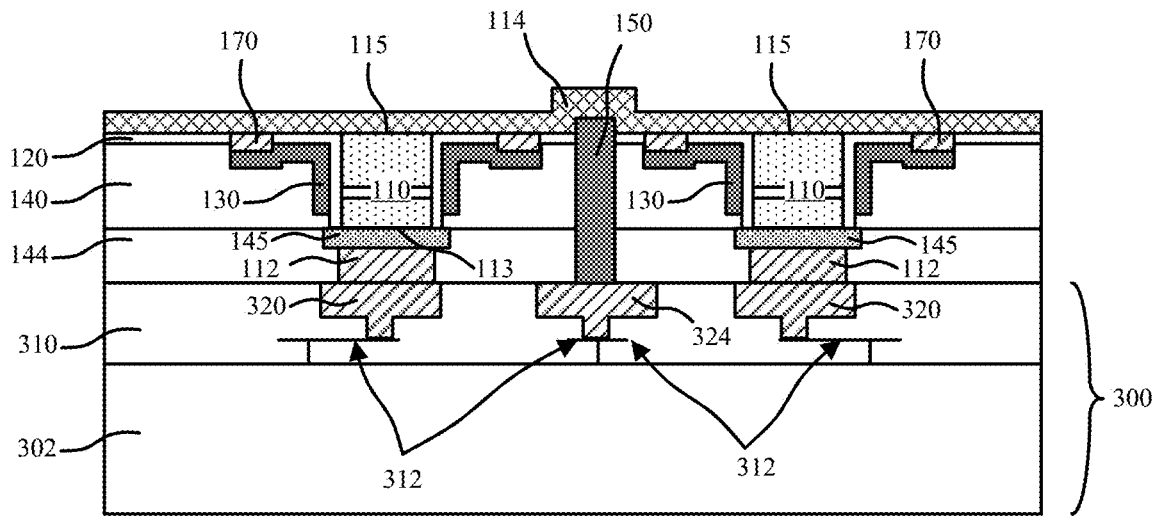
FIG. 11A is a schematic cross-sectional side view illustration of a first option of a micro LED with sidewall gate electrode connected to cathode in accordance with an embodiment.
Figure 11B:
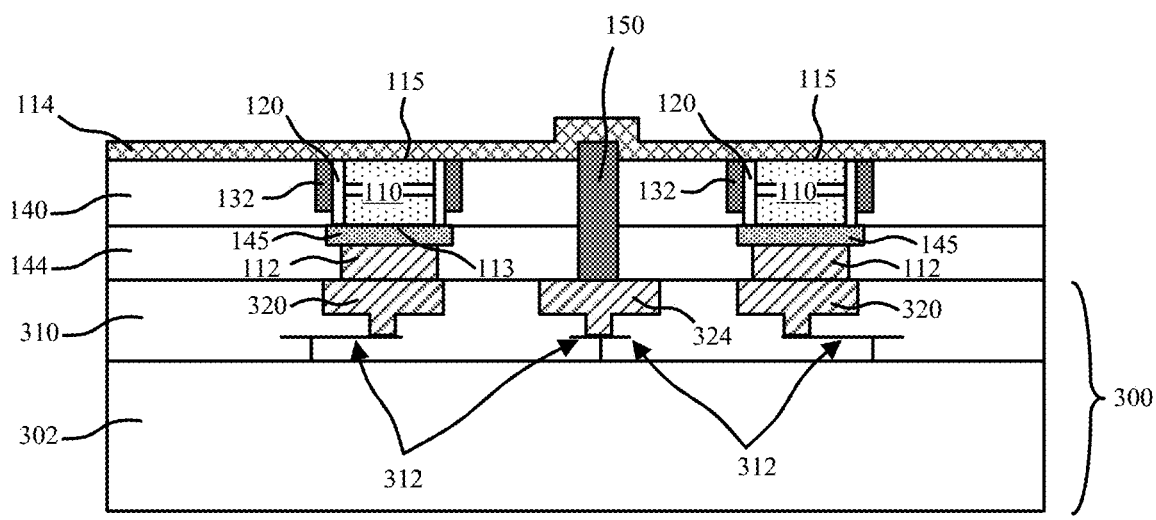
FIG. 11B is a schematic cross-sectional side view illustration of a second option of a micro LED with sidewall gate electrode connected to cathode in accordance with an embodiment.

Referring now to FIGS. 11A-11B schematic cross-sectional side view illustrations are provided of a first option (FIG. 11A) and second option (FIG. 11B) of a micro LED with sidewall gate electrode 130 connected to cathode in accordance with embodiments. The integration sequences may be similar to those previously described with regard to FIGS. 8A-8B. Similar to that of FIG. 8A, the sidewall gate electrode 130, conductive vias 170 and dielectric layer 120 may remain intact in the embodiment illustrated in FIG. 11A. Similar to that of FIG. 8B, thinning may be performed to remove the top lateral flanged layer portion 134 of the sidewall gate electrode 130. In such a processing sequence, the conductive vias 170 would not have needed to be previously formed.

Figure 12:
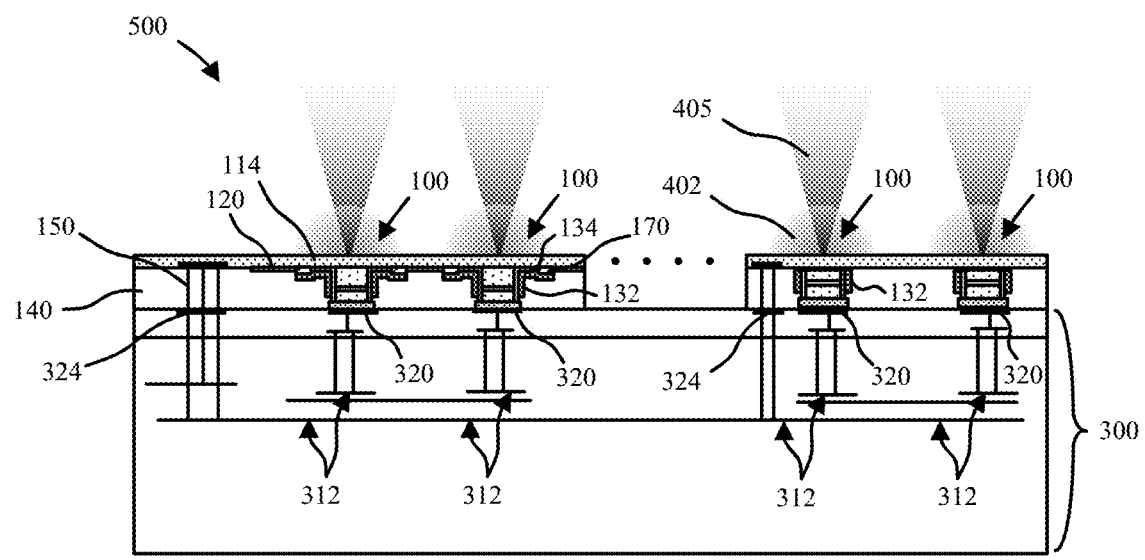
FIG. 12 is a schematic cross-sectional side view illustration of a display structure including micro LEDs with sidewall gate electrodes connected to cathode in accordance with an embodiment.

FIG. 12 is a schematic cross-sectional side view illustration of a display structure including micro LEDs 100 of FIGS. 11A and 11B with sidewall gate electrodes 130 connected to cathode in accordance with an embodiment. More particularly, FIG. 12 illustrates an arrangement micro LEDs 100 of FIG. 11A on the left side of the illustration, and micro LEDs 100 of FIG. 11B on the right in order to illustrate similar integration schemes.

In an embodiment, a display structure 500 includes a display substrate 300 including a driver contact pad 320. A micro LED 100 is connected to the display substrate, with the micro LED 100 including a p-n diode 110 characterized by a top electrode side 115, a bottom electrode side 113 connected with the driver contact pad 320, and an active layer therebetween. A sidewall gate electrode 130 spans a sidewall 111 of the p-n diode 110 that includes the active layer 107. In operation, a bias may be applied to the sidewall gate electrode 130 to deplete a minority carrier concentration from the sidewall 111. A dielectric layer 120 additionally may span along the p-n diode sidewall 111 between the p-n diode 110 and the sidewall gate electrode 130. A top electrically conductive layer 114 additionally may span over and in electrical contact with the top electrode side 115. In a particular application, a lens 402 can be formed over each micro LED 100. For example, the lenses 402 may be half-ball shaped transparent, high index material to control on-axis light intensity of the emission cone 405. For example, a high index material may have an index of refraction of n=1.2-2.5. Embodiments are not limited to half-ball shaped lenses, and can include alternative shapes such as conical.

As illustrated in FIGS. 12, the sidewall gate electrode 130 may include a sidewall layer portion 132 and a top lateral flanged layer portion 134, or just the sidewall layer portion 132. In both configurations, the top electrically conductive layer 114 is over and in electrical contact with the sidewall gate electrode 130.

In an embodiment, the sidewall gate electrode 130 includes a sidewall layer portion 132 and a top lateral flanged layer portion 134. The dielectric layer 120 may additionally span over the top lateral flanged layer portion 132 of the sidewall gate electrode. In an embodiment, a conductive via 170 extends through the dielectric layer 120 and is in physical contact with the top flanged layer portion 134 of the sidewall gate electrode, and further where the top electrically conductive layer 114 is on and in electrical contact with the conductive via 170.

In an embodiment, the top electrically conductive layer 114 is on and in electrical contact with the sidewall gate electrode 130. In this configuration, the top electrically conductive layer 114 is connected to both the sidewall gate electrode 130 and the p-n diode 110.

FIGS. 13A-13E are schematic cross-sectional side view illustrations of a sequence for forming a micro LEDs 100 with separate sidewall gate electrodes 130 in accordance with an embodiment. FIGS. 14A-14E are schematic cross-sectional side view illustrations of a sequence for forming a micro LEDs 100 with separate sidewall gate electrodes that leverages dummy p-n diodes in accordance with an embodiment.

The sequences of FIGS. 13A-13E and FIGS. 14A-14E are similar to the sequence of FIGS. 10A-10D, with a difference being omission of the conductive vias 170, and provision of separate gate contact terminals 180 for the separate sidewall gate electrodes 130. In interest of clarity and conciseness the process flows are described concurrently. In each sequence the process begins with a donor p-n diode wafer 201 as previously described. The p-n diode layer 109 is then patterned for form an array of p-n diodes 110, followed by global deposition of a dielectric layer 120, and formation of the sidewall gate electrodes 130. In the embodiment illustrated in FIG. 13B a separate sidewall gate electrode 130 is formed around each p-n diode 110 similarly as described with regard to FIG. 10B. In the embodiment illustrated in FIG. 14B a sidewall gate electrode is formed around one or more p-n diodes 110 similarly as described with regard to FIG. 10B and additionally over the bottom electrode side 113 of a dummy p-n diode 110X.

This may be followed by deposition of a planarization layer 144, followed by patterning, formation of bottom electrodes 112 and gating electrodes 182 in the patterned planarization layer 144, and a final planarization operation to prepare planarized bottom surfaces 116, 142, and 184 for bonding. In the embodiment illustrated in FIG. 13C gate contact terminals 180 may be formed through the dielectric fill layer 140 and optionally planarization layer 144 prior to formation of the gating electrodes 182. In the embodiment illustrated in FIG. 14C the gating electrodes 182 can be formed on a portion of the sidewall gate electrode 130 that extends over the bottom electrode side 113 of a dummy p-n diode 110X. In this manner, the dummy p-n diode 110X is used to facilitate sidewall gating of one or more adjacent micro LEDs 100, and may be inactive (non-emitting). The dummy p-n diode 110X may be electrically insulated from the sidewall gate electrode 130 by the dielectric layer 120. As shown, in FIGS. 13D and 14D, the patterned growth substrate can then be bonded to a display substrate 300 similarly as previously described with regard to FIG. 7D. The display substrate may additionally include gate driver circuits 332 connected to gate driver contact pads 330. During substrate-to-substrate bonding the gating electrodes 182 may be bonded to the gate driver contact pads 330.

Figure 13A:
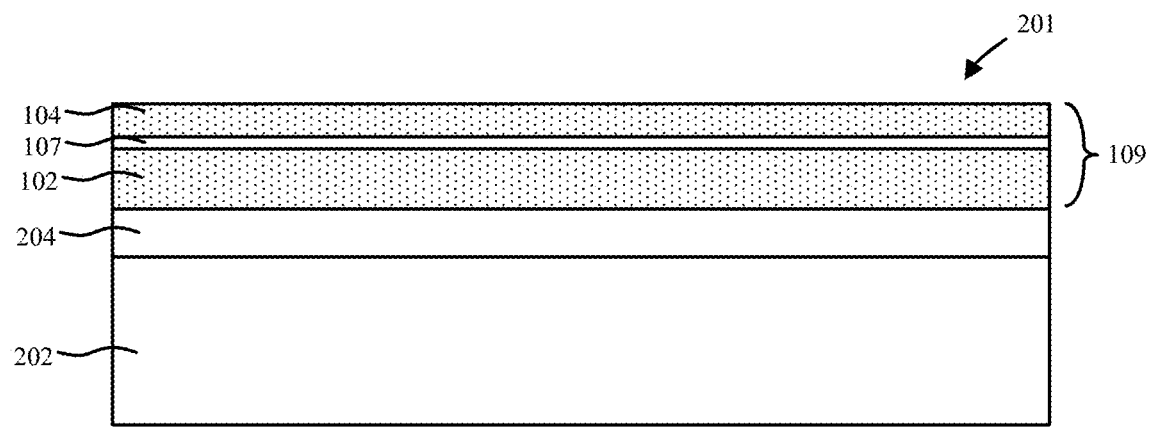
FIGS. 13A-13E are schematic cross-sectional side view illustrations of a sequence for forming a micro LEDs with separate sidewall gate electrodes in accordance with an embodiment.
Figure 13B:
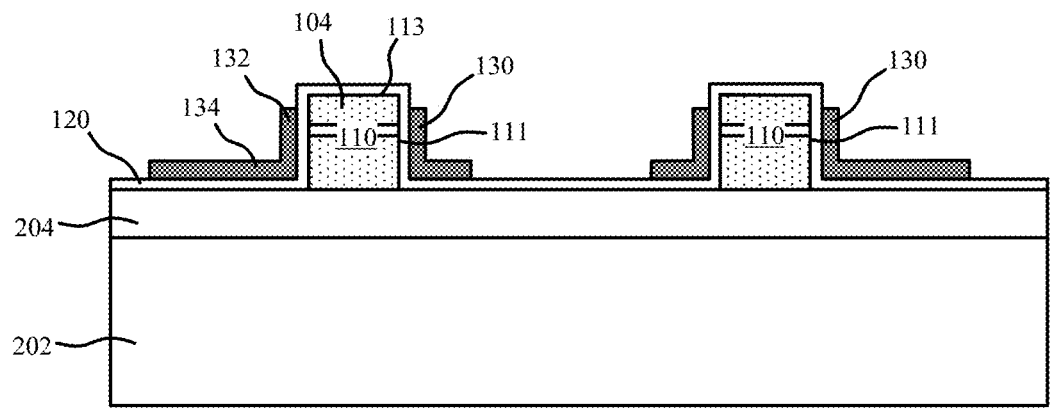
Figure 13C:
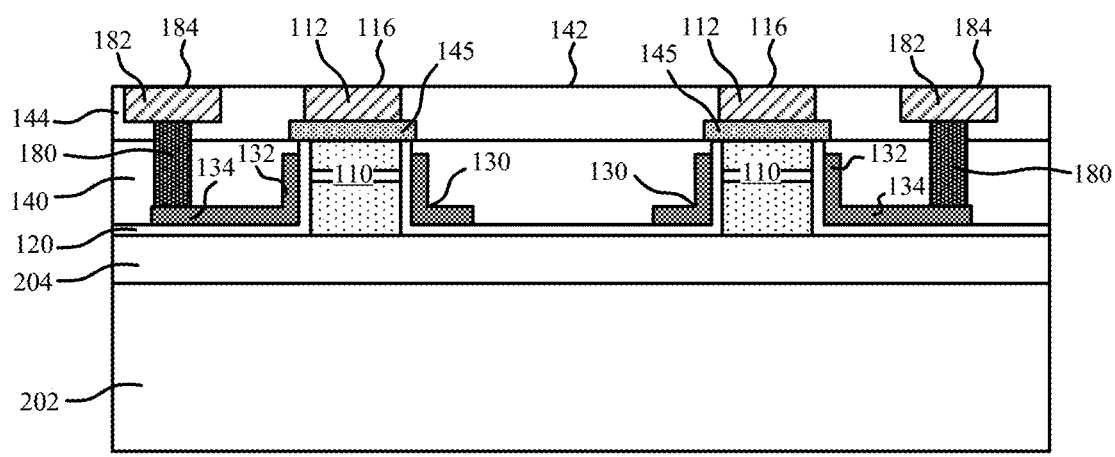
Figure 13D:
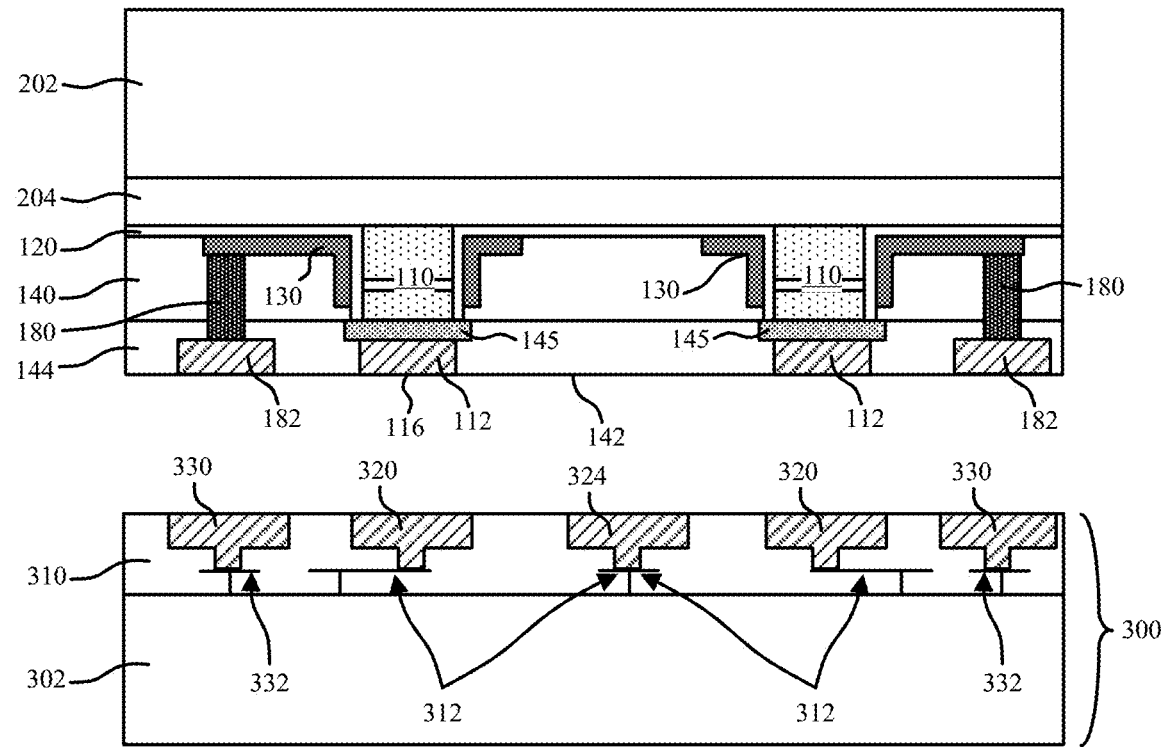
Figure 13E:
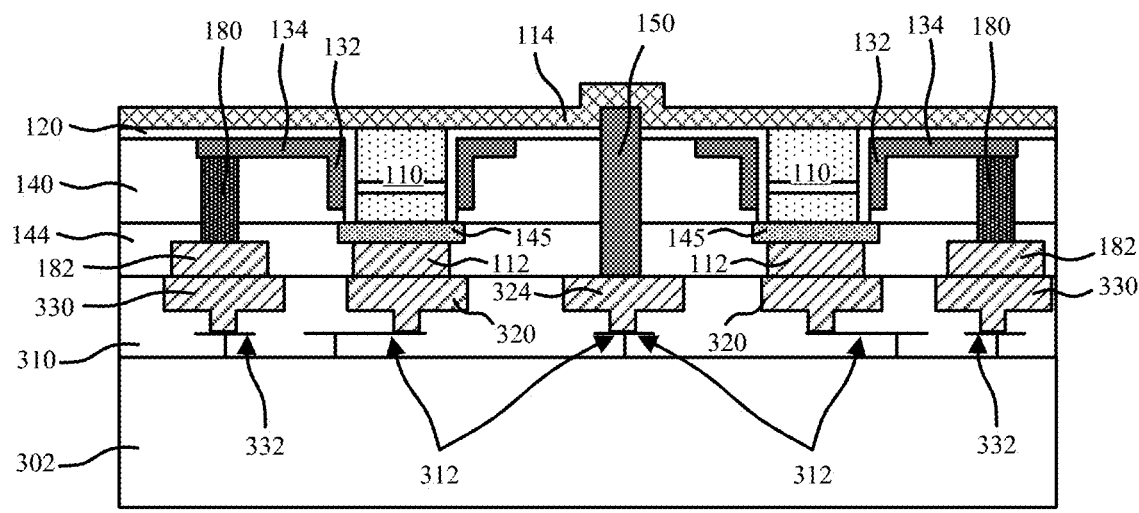
Figure 14A:
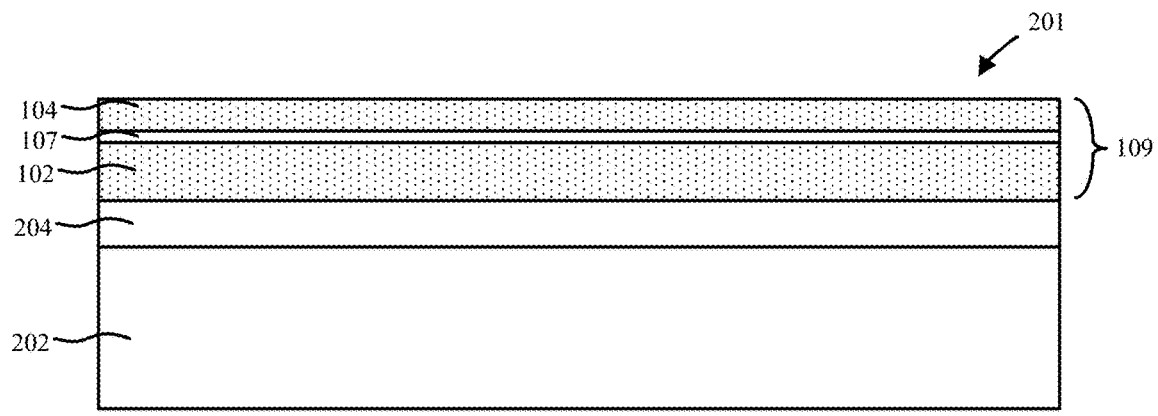
FIGS. 14A-14E are schematic cross-sectional side view illustrations of a sequence for forming a micro LEDs with separate sidewall gate electrodes that leverages dummy p-n diodes in accordance with an embodiment.
Figure 14B:
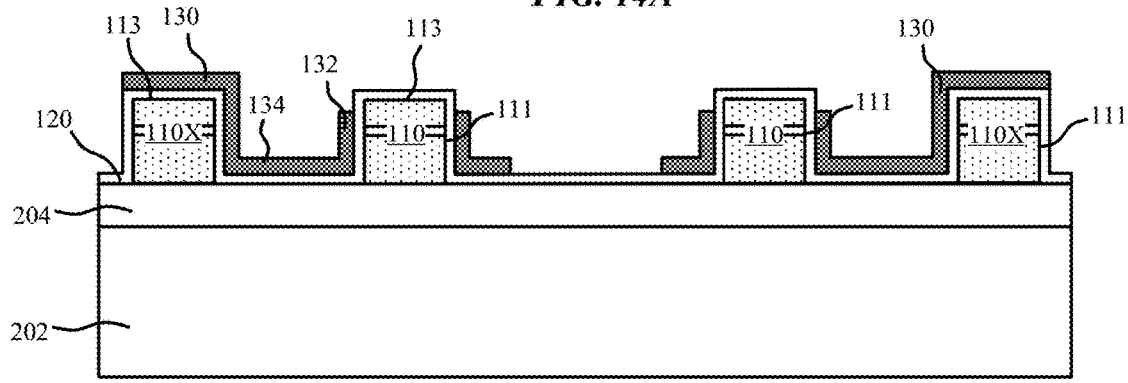
Figure 14C:
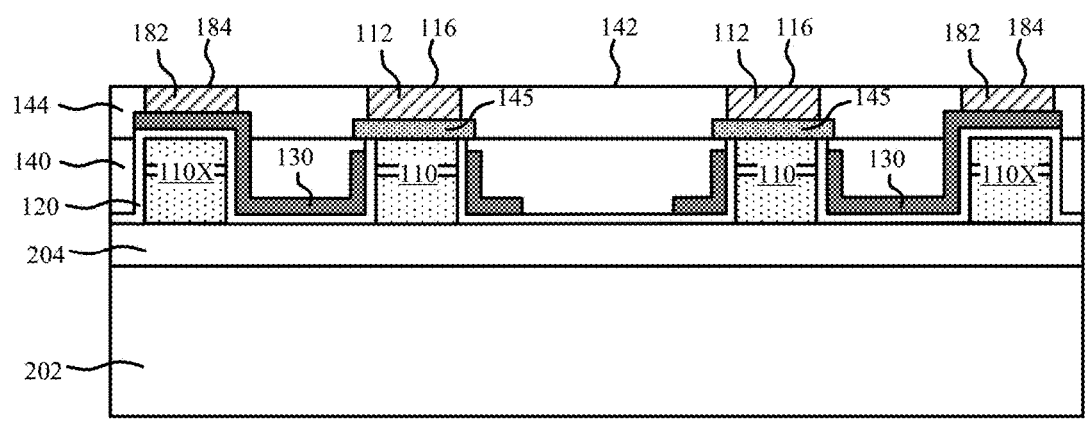
Figure 14D:
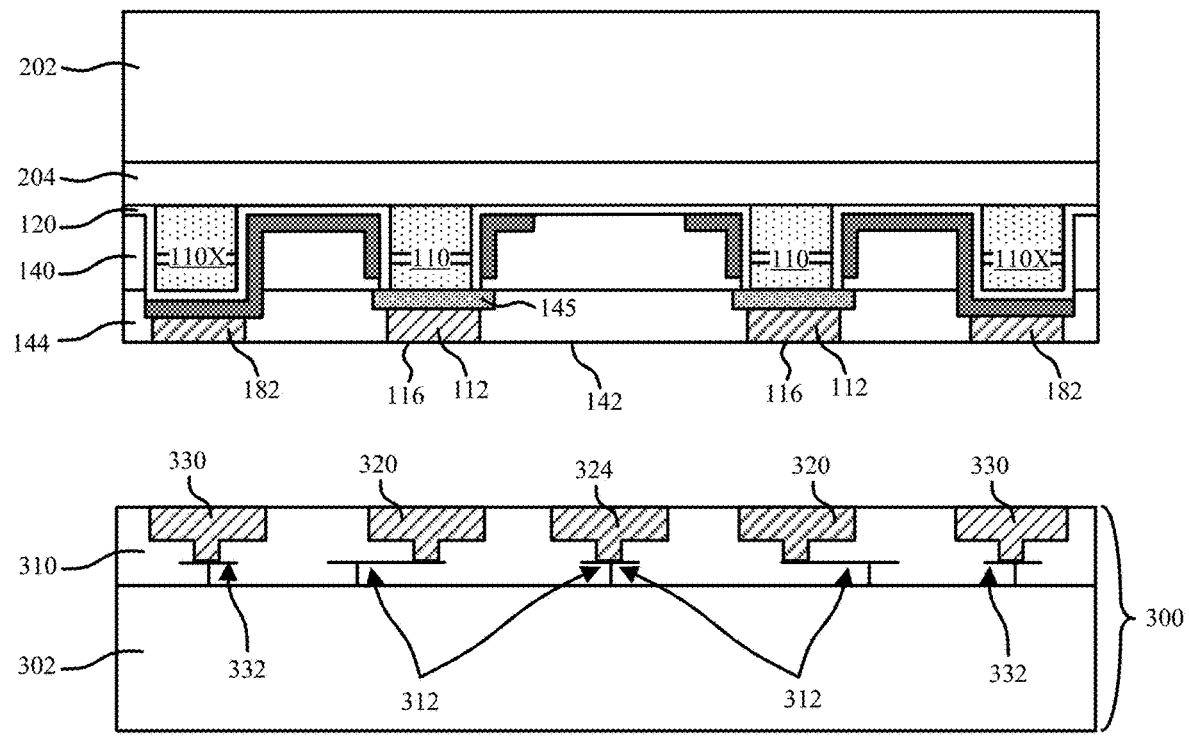
Figure 14E:
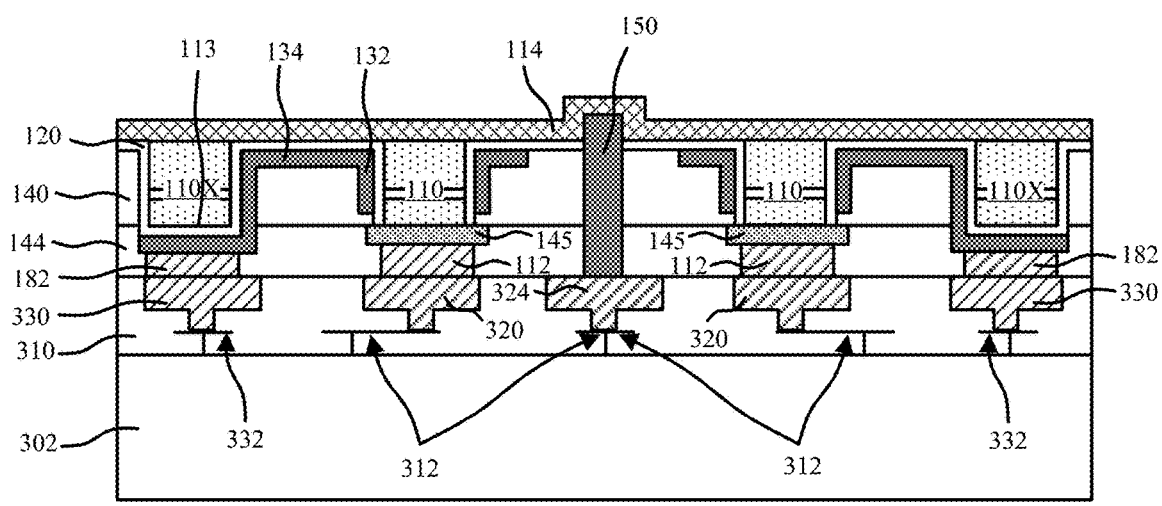

Referring now to FIGS. 13E and 14E schematic cross-sectional side view illustrations are provided of a first option (FIG. 13D) and second option (FIG. 14D) of separate, stand-alone micro sidewall gate electrode 130 configurations in accordance with embodiments. The integration sequences may be similar to that previously described with regard to FIG. 8A. Similar to that of FIG. 8A, the sidewall gate electrode 130 and dielectric layer 120 may remain intact.

Figure 15:
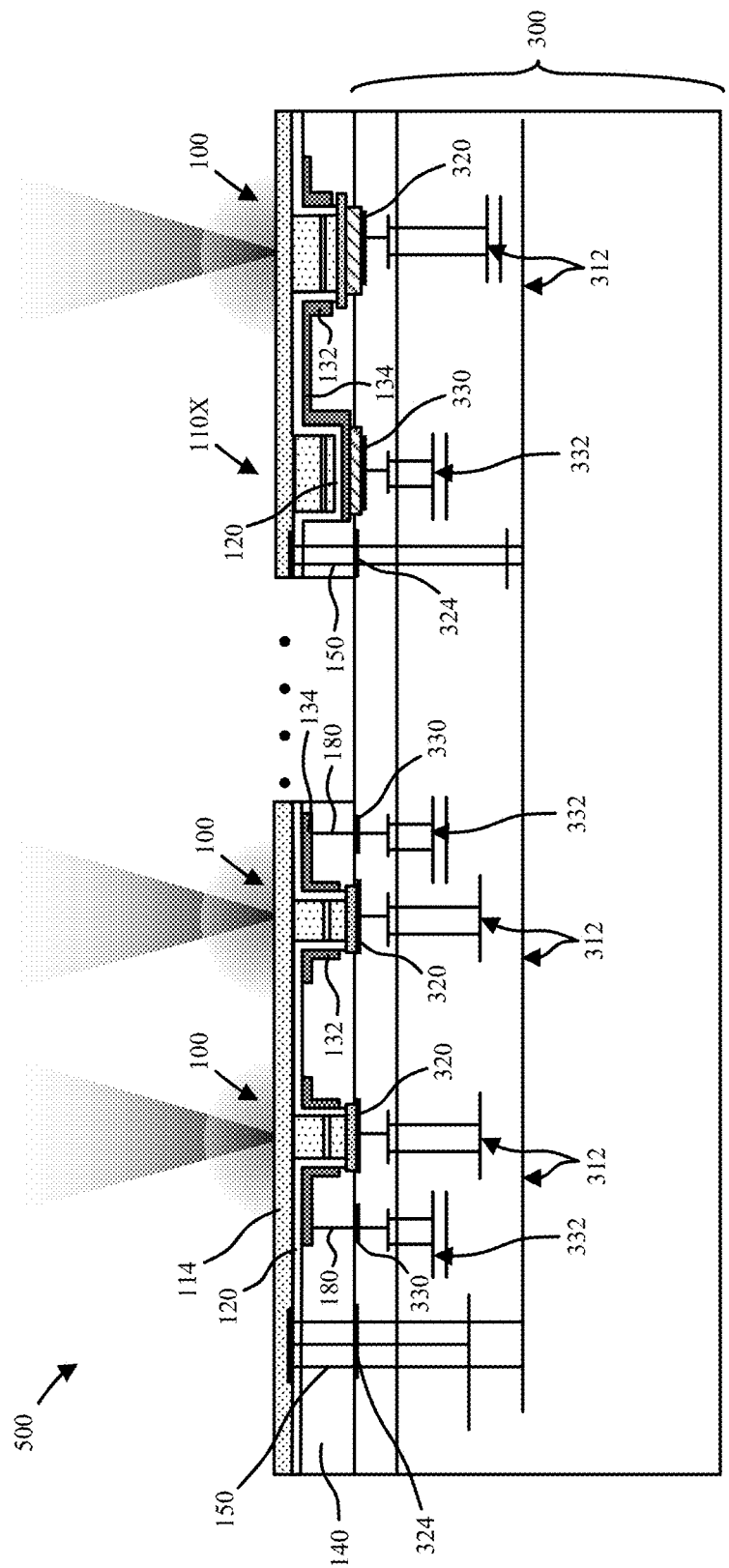
FIG. 15 is a schematic cross-sectional side view illustration of a display structure including micro LEDs with separate sidewall gate electrodes connected to corresponding gate drivers in accordance with an embodiment.

FIG. 15 is a schematic cross-sectional side view illustration of a display structure including micro LEDs 100 of FIGS. 13E and 14E with separate, stand-alone sidewall gate electrodes 130 in accordance with embodiments. More particularly, FIG. 15 illustrates an arrangement micro LEDs 100 of FIG. 13E on the left side of the illustration, and micro LEDs 100 of FIG. 14E on the right in order to illustrate similar integration schemes.

In an embodiment, a display structure 500 includes a display substrate 300 including a driver contact pad 320. A micro LED 100 is connected to the display substrate, with the micro LED 100 including a p-n diode 110 characterized by a top electrode side 115, a bottom electrode side 113 connected with the driver contact pad 320, and an active layer therebetween. A sidewall gate electrode 130 spans a sidewall 111 of the p-n diode 110 that includes the active layer 107. In operation, a bias may be applied to the sidewall gate electrode 130 to deplete a minority carrier concentration from the sidewall 111. A dielectric layer 120 additionally may span along the p-n diode sidewall 111 between the p-n diode 110 and the sidewall gate electrode 130. A top electrically conductive layer 114 additionally may span over and in electrical contact with the top electrode side 115. In a particular application, a lens 402 can be formed over each micro LED 100. For example, the lenses 402 may be half-ball shaped transparent, high index material to control on-axis light intensity of the emission cone 405. For example, a high index material may have an index of refraction of n=1.2-2.5. Embodiments are not limited to half-ball shaped lenses, and can include alternative shapes such as conical.

As illustrated in FIGS. 15, the sidewall gate electrode 130 is electrically isolated from the top electrode sides 115 and the bottom electrode sides 113 of the p-n diodes 110. The display substrate 300 may further include gate driver circuits 332 connected with the sidewall gate electrodes 130, and display driver circuits 312 connected with the bottom electrodes 112 (and contact terminals 150).

In some embodiments, all p-n diode 110 mesas in the display structure 500 are functional micro LEDs. In an embodiment, the sidewall gate electrode 130 includes a sidewall layer portion 132 and a top lateral flanged layer portion 134. The dielectric layer 120 may span over the top layer flanged layer portion 134 of the sidewall gate electrode. Additionally, a gate driver circuit 332 is connected to the top flanged layer portion 134 of the sidewall gate electrode, for example, through gate contact terminals 180.

In some embodiments, some p-n diode 110 mesas in the display structure 500 are dummy p-n diodes 110X. In this manner, the dummy p-n diodes 110X can be used to contact the gate driver circuits 332. For example, the sidewall gate electrode 130 for an active micro LED 100 can span underneath (e.g. underneath bottom electrode side 113) of an adjacent dummy p-n diode 110X, with the gate driver circuit 332 being connected to a portion of the sidewall gate electrode 130 that spans underneath the adjacent dummy p-n diode 110X.

Method of operating a display in accordance with embodiments may include applying a bias (e.g. voltage) to a micro LED to control the surface state of the micro LED near the micro LED sidewalls 111, for example to deplete a minority carrier concentration from the sidewalls. In an embodiment, a method of operating a display includes sending a drive signal to a driver contact pad 320 upon which a micro LED 100 is mounted, the micro LED 100 including a p-n diode, a top electrode side 115, a bottom electrode side 113 connected with the driver contact pad 320, and a sidewall gate electrode 130 spanning a sidewall 111 of the p-n diode 110 including an active layer 107 of the p-n diode 110. In accordance with embodiments a bias (e.g. voltage) is applied to the sidewall gate electrode 130 to deplete a minority carrier concentration from the sidewall 111.

In some embodiments, the bias applied to the sidewall gate electrode 130 is electrically isolated from the top electrode side 115 and the bottom electrode side 113. In order of operation, the bias can be applied to the sidewall gate electrode 130 prior to sending the drive signal to the driver contact pad 320. For example, this may occur with separate, stand-alone sidewall gate electrodes, though the bias can also be simultaneously applied to the sidewall gate electrode 130 and the top electrode side 115. The bias may be a continuous wave, pulsed wave, or sinusoidal wave function, for example.

In some embodiments bias is simultaneously applied to the sidewall gate electrode 130 and the top electrode side 115. For example, this occurs when the sidewall gate electrode 130 is also connected to the anode or cathode.

The sidewall gating in accordance with embodiments can have the same or different voltage biases for micro LEDs on the same functional array. For a micro LED display structure with sidewall gate electrodes, the display substrate can have a common cathode connection and independent anode connection, or common anode connection and independent cathode connection, or independent connections for both anodes and cathodes. The micro LEDs of the same array may have separate sidewall gate electrodes 130, connected sidewall gate electrodes 130 or their combinations. For a display structures with independently controlled sidewall gate electrodes 130, the gating electrodes 182 can be connected with either n-MOS or p-MOS for the realization of positive or negative bias on the sidewalls 111. The gate driver circuits 332 can supply continuous wave, pulsed wave or sinusoidal wave to the sidewall gate electrodes 130. For display structure with independently controlled sidewall gate electrodes 130, the voltage on the sidewall gate electrode 130 can be varied to adjust for micro LED intensity variations. Voltage stress on the sidewall gate electrode 130 can be applied before turning on the micro LEDs to charge-up or deplete the trap states near the sidewalls 111. In some embodiments, the stress voltage can be adjusted in a wide range, such as in the range of −12 to 12 V.

FIGS. 16A-16E are schematic cross-sectional side view illustrations of a sequence for forming a micro LEDs with injection of fixed charge for passive gating in accordance with an embodiment. The process sequence may begin with a donor p-n diode wafer 201 similar to that previously described with regard to FIG. 7A. An array of p-n diodes 110 are then patterned as previously described, followed by formation of injection region 135 near the sidewalls 111 of the p-n diode 110 spanning at least the active layer 107, similarly as previously described with regard to FIG. 6D, followed by the formation of dielectric layer 120. The injection region 135 of fixed charges can alternatively, or additionally, exist in the interface of the dielectric layer 120 and p-n diode 110, or inside the dielectric layer 120 as previously described with regard to FIG. 6E. Any of the sidewall gating configurations can additionally be integrated into the structure as well.

Figure 16A:
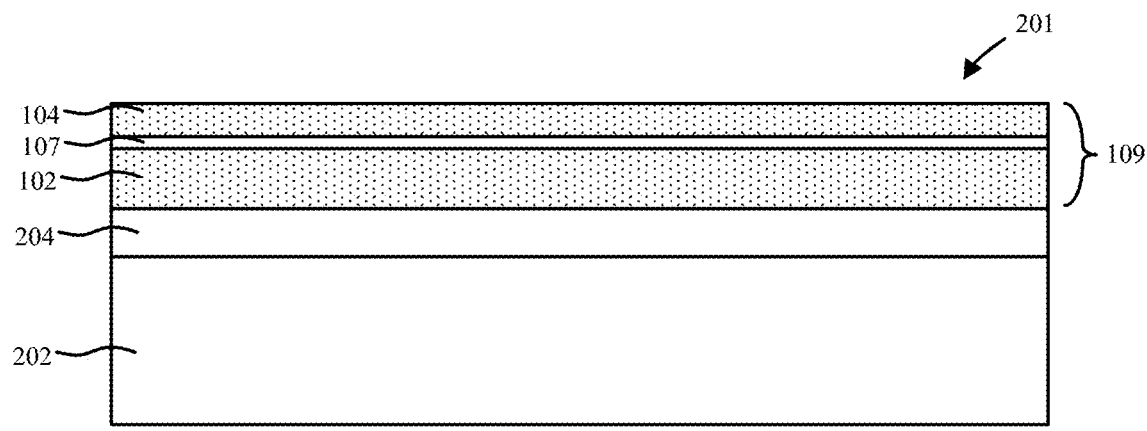
FIGS. 16A-16E are schematic cross-sectional side view illustrations of a sequence for forming a micro LEDs with injection of fixed charge for passive gating in accordance with an embodiment.
Figure 16B:
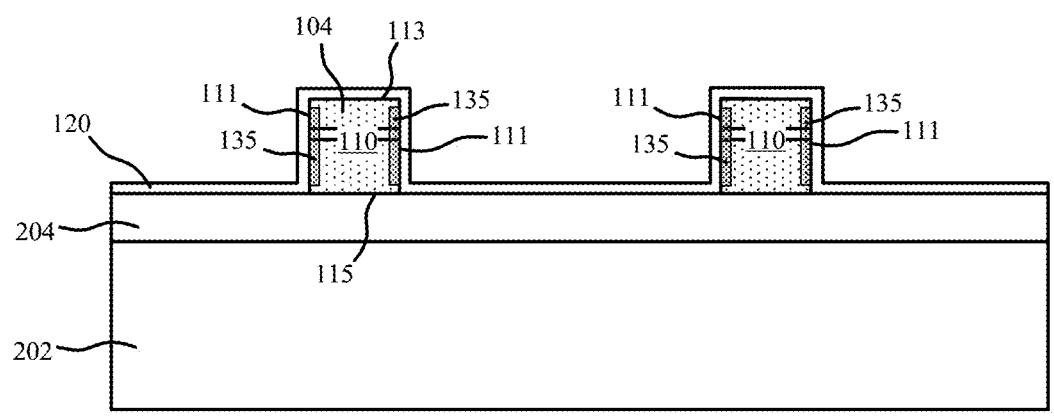
Figure 16C:
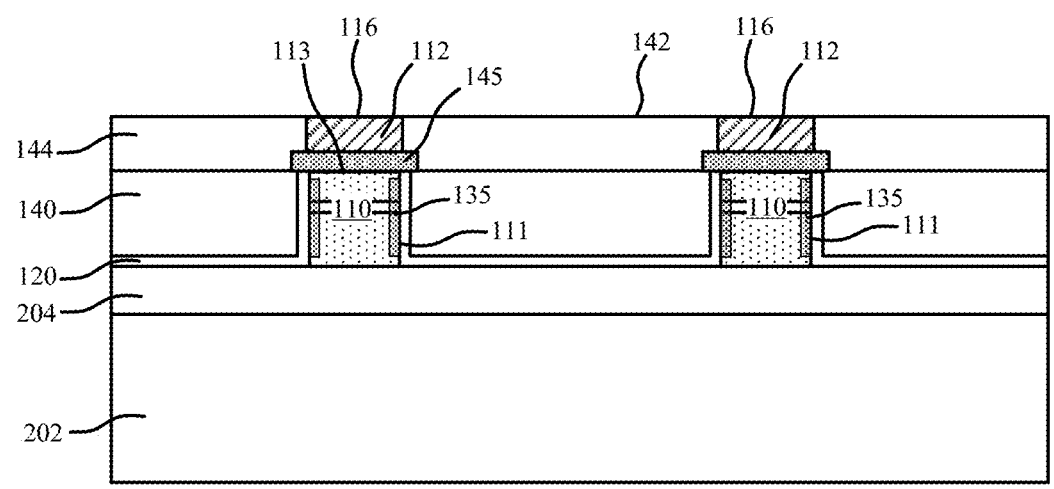
Figure 16D:
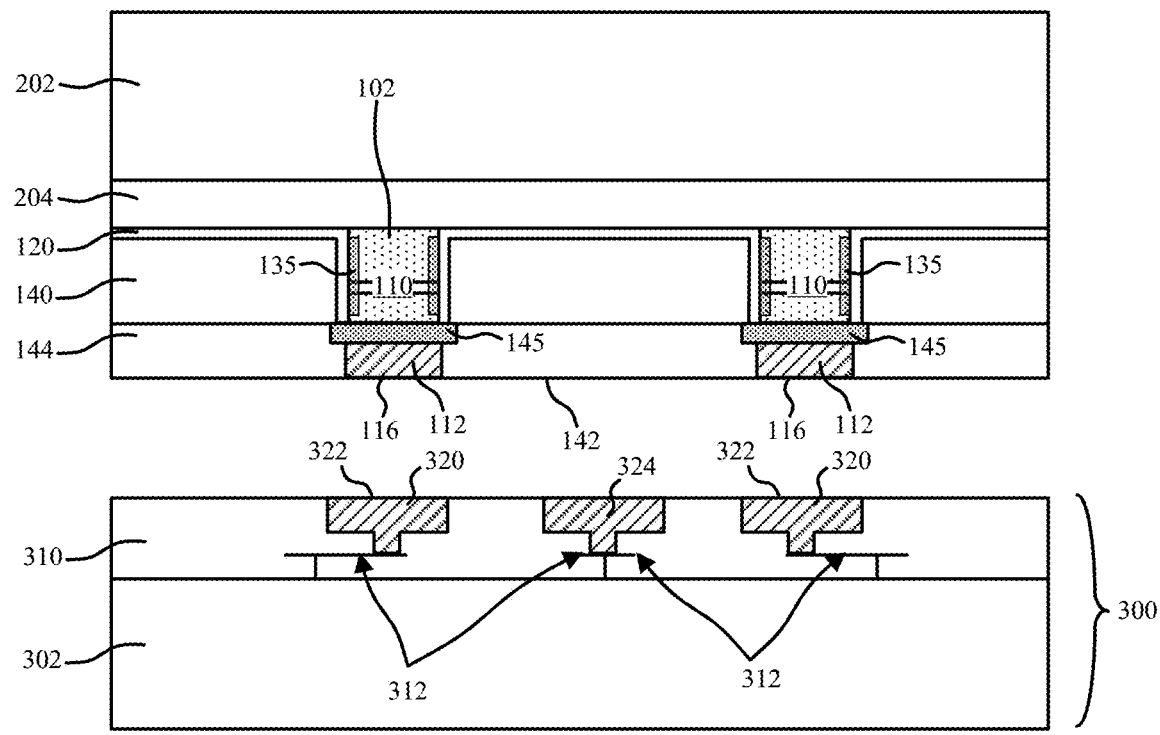

A dielectric fill layer 140 can then be deposited over the patterned structure as shown in FIG. 16C, and planarized to expose, or re-establish the bottom electrode side 113 of the p-n diode 110. The planarization operation may optionally reduce a thickness of the doped layer 104. Separate electrode contact layers 145 can then be formed on the bottom electrode side 113 of each p-n diode 110. This may be followed by deposition of a planarization layer 144, followed by patterning, formation of bottom electrodes 112 in the patterned planarization layer 144, and a final planarization operation to prepare planarized bottom surfaces 116 and 142 for bonding. As shown, in FIG. 16D, the patterned growth substrate of FIG. 16C can then be bonded to a display substrate 300 similarly as previously described with regard to FIG. 7D.

Figure 16E:
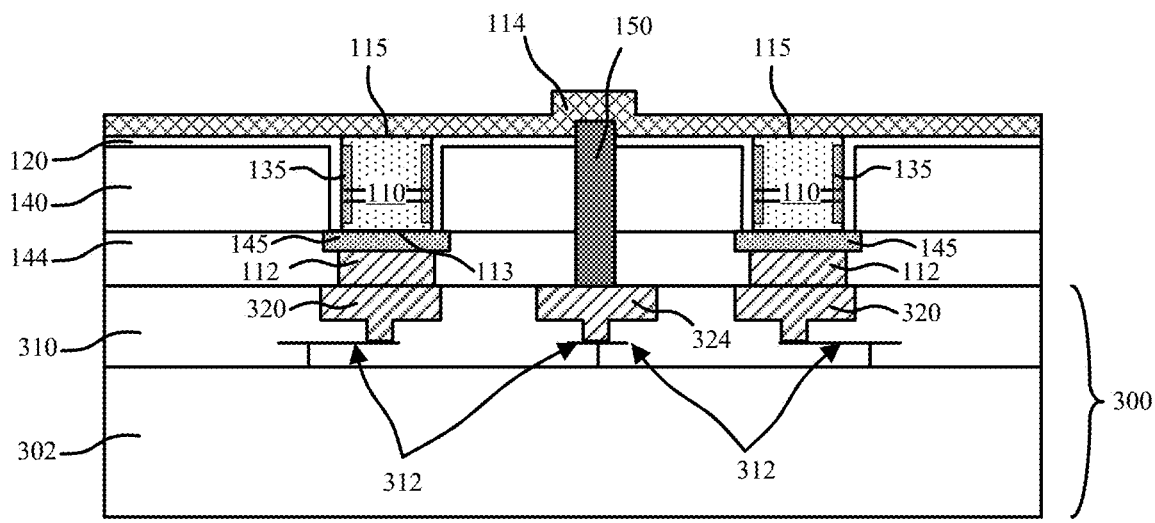

Referring now to FIG. 16E the integration sequence may be similar to those previously described with regard to FIGS. 8A-8B. Similar to that of FIG. 8A, the sidewall gate electrode 130, conductive vias 170 and dielectric layer 120 may remain intact in the embodiment illustrated in. While not separately illustrated, thinning may be performed to remove a thickness of the p-n diode, which may also remove the dielectric layer 120 spanning between the p-n diodes 110.

Figure 17:
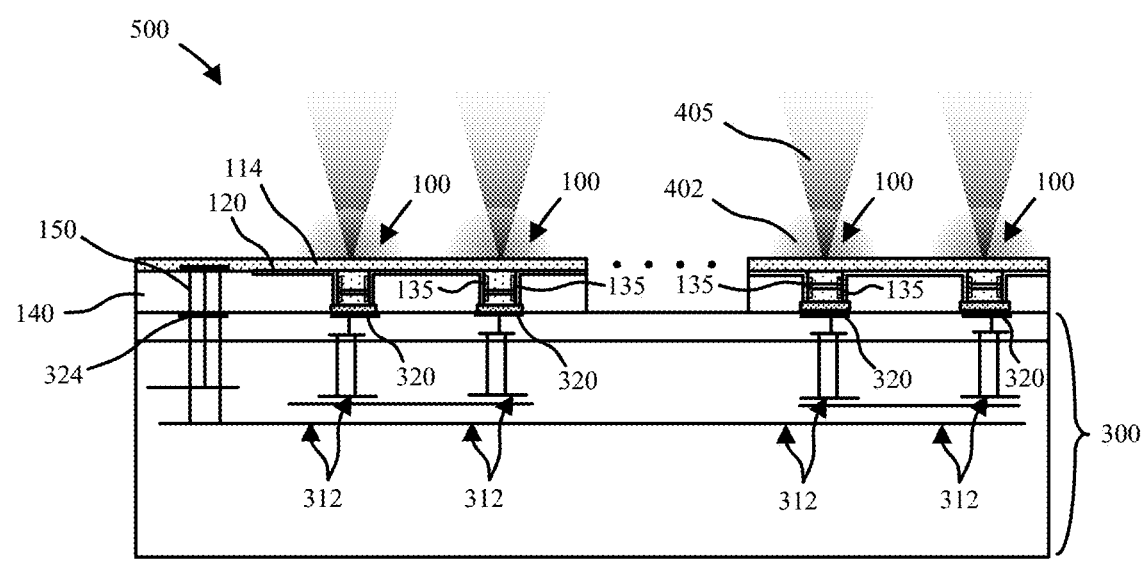
FIG. 17 is a schematic cross-sectional side view illustration of a display structure including micro LEDs with injection of fixed charge for passive gating in accordance with an embodiment.

FIG. 17 is a schematic cross-sectional side view illustration of a display structure 500 including micro LEDs 100 of FIG. 16E with injection regions 135 for passive gating in accordance with an embodiment. In an embodiment, a display structure 500 includes a display substrate 300 including a driver contact pad 320. A micro LED 100 is connected to the display substrate, with the micro LED 100 including a p-n diode 110 characterized by a top electrode side, a bottom electrode side connected with the driver contact pad 320, and an active layer therebetween as previously described. An injection region 135 of fixed charges spans a sidewall 111 or all sidewalls of the p-n diode including the active layer to deplete a minority carrier concentration from the sidewall 111. In an embodiment, the injection region is less than 500 nm wide (encroaches less than 500 nm into the interior of the p-n diode from the sidewall 111). In an embodiment, the injection region 135 includes fluorine ions. The injection region 135 may optionally also exist inside the dielectric layer 120.

In utilizing the various aspects of the embodiments, it would become apparent to one skilled in the art that combinations or variations of the above embodiments are possible for controlling micro LED performance with sidewall gating. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display structure comprising:
   a display substrate including a driver contact pad;
   a micro light emitting diode (LED) including a p-n diode comprising a top electrode side, a bottom electrode side connected with the driver contact pad, and an active layer therebetween;
   a metal sidewall gate electrode spanning a sidewall of the p-n diode including the active layer of the p-n diode to deplete a minority carrier concentration from the sidewall;
   a dielectric layer spanning along the p-n diode sidewall between the p-n diode and the sidewall gate electrode; and
   a top electrically conductive layer over and in electrical contact with the top electrode side, wherein the top electrically conductive layer comprises a transparent conductive oxide or transparent conductive polymer and spans entirely across the top electrode side of the p-n diode;
   wherein the top electrically conductive layer is over and in electrical contact with the sidewall gate electrode such that a potential applied to the top electrically conductive layer is applied to the sidewall gate electrode.

2. The display structure of claim 1, wherein the sidewall gate electrode includes a sidewall layer portion and a top lateral flanged layer portion.

3. The display structure of claim 2, wherein the dielectric layer spans over the top lateral flanged layer portion of the sidewall gate electrode.

4. The display structure of claim 3, further comprising a conductive via extending through the dielectric layer and in physical contact with the top flanged layer portion of the sidewall gate electrode, wherein the top electrically conductive layer is on and in electrical contact with the conductive via.

5. The display structure of claim 1, wherein the top electrically conductive layer is directly on and in electrical contact with the sidewall gate electrode.

6. The display structure of claim 1, wherein the p-n diode has a maximum lateral width of less than 10 microns and the dielectric layer has a maximum thickness of less than 300 nm.

7. The display structure of claim 6, wherein the sidewall gate electrode completely laterally surrounds a thickness of the p-n diode.

8. A display structure comprising:
a display substrate including a driver contact pad;
a micro light emitting diode (LED) including a p-n diode comprising a top electrode side, a bottom electrode side connected with the driver contact pad, and an active layer therebetween;
a sidewall gate electrode spanning a sidewall of the p-n diode including the active layer of the p-n diode to deplete a minority carrier concentration from the sidewall;
a dielectric layer spanning along the p-n diode sidewall between the p-n diode and the sidewall gate electrode;
a top electrically conductive layer over and in electrical contact with the top electrode side;
wherein the sidewall gate electrode is electrically isolated from the top electrode side and the bottom electrode side;
wherein the display substrate comprises a gate driver circuit connected with the sidewall gate electrode, and a display driver circuit connected with the driver contact pad; and
wherein the sidewall gate electrode spans underneath an adjacent dummy p-n diode, and the gate driver circuit is connected to a portion of the sidewall gate electrode that spans underneath the adjacent dummy p-n diode and is electrically isolated from the adjacent dummy p-n diode by a portion of the dielectric layer that spans underneath the adjacent dummy p-n diode.

9. The display structure of claim 8, wherein the sidewall gate electrode includes a sidewall layer portion and a top lateral flanged layer portion.

10. The display structure of claim 9, wherein the dielectric layer spans over the top lateral flanged layer portion of the sidewall gate electrode.

11. The display structure of claim 10, wherein the gate driver circuit is connected to the top flanged layer portion of the sidewall gate electrode.

* * * * *